United States Patent
Qi et al.

(10) Patent No.: US 6,697,294 B1
(45) Date of Patent: Feb. 24, 2004

(54) DESIGNS OF REFERENCE CELLS FOR MAGNETIC TUNNEL JUNCTION (MTJ) MRAM

(75) Inventors: Qiuqun Qi, Fremont, CA (US); Xizeng Shi, Fremont, CA (US); Matthew R. Gibbons, Livermore, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 179 days.

(21) Appl. No.: 10/055,118

(22) Filed: Jan. 22, 2002

Related U.S. Application Data

(63) Continuation-in-part of application No. 10/017,647, filed on Dec. 12, 2001.
(60) Provisional application No. 60/271,169, filed on Feb. 23, 2001.

(51) Int. Cl.[7] .................................................. G11C 7/02
(52) U.S. Cl. ........................ 365/210; 365/173; 365/209
(58) Field of Search ................................. 365/210, 171, 365/173, 158, 209

(56) References Cited

U.S. PATENT DOCUMENTS

| | | | |
|---|---|---|---|
| 5,940,319 | A | 8/1999 | Durlam et al. |
| 6,174,737 | B1 | 1/2001 | Durlam et al. |
| 6,185,143 | B1 | 2/2001 | Perner et al. |
| 6,269,018 | B1 * | 7/2001 | Monsma et al. ............ 365/145 |
| 6,317,376 | B1 | 11/2001 | Tran et al. |
| 6,418,048 | B1 * | 7/2002 | Sin et al. .................... 365/173 |

* cited by examiner

*Primary Examiner*—Michael S. Lebentritt
*Assistant Examiner*—Hien Nguyen
(74) *Attorney, Agent, or Firm*—Carr & Ferrell LLP

(57) ABSTRACT

A reference cell circuit for a magnetic tunnel junction MRAM includes two magnetic tunnel junctions where one is always set to a low resistance state and the other is always set to a high resistance state. The two magnetic tunnel junctions are connected between two segments of a bit line. The reference cell also includes a digit line that crosses both of the bit line segments.

26 Claims, 15 Drawing Sheets

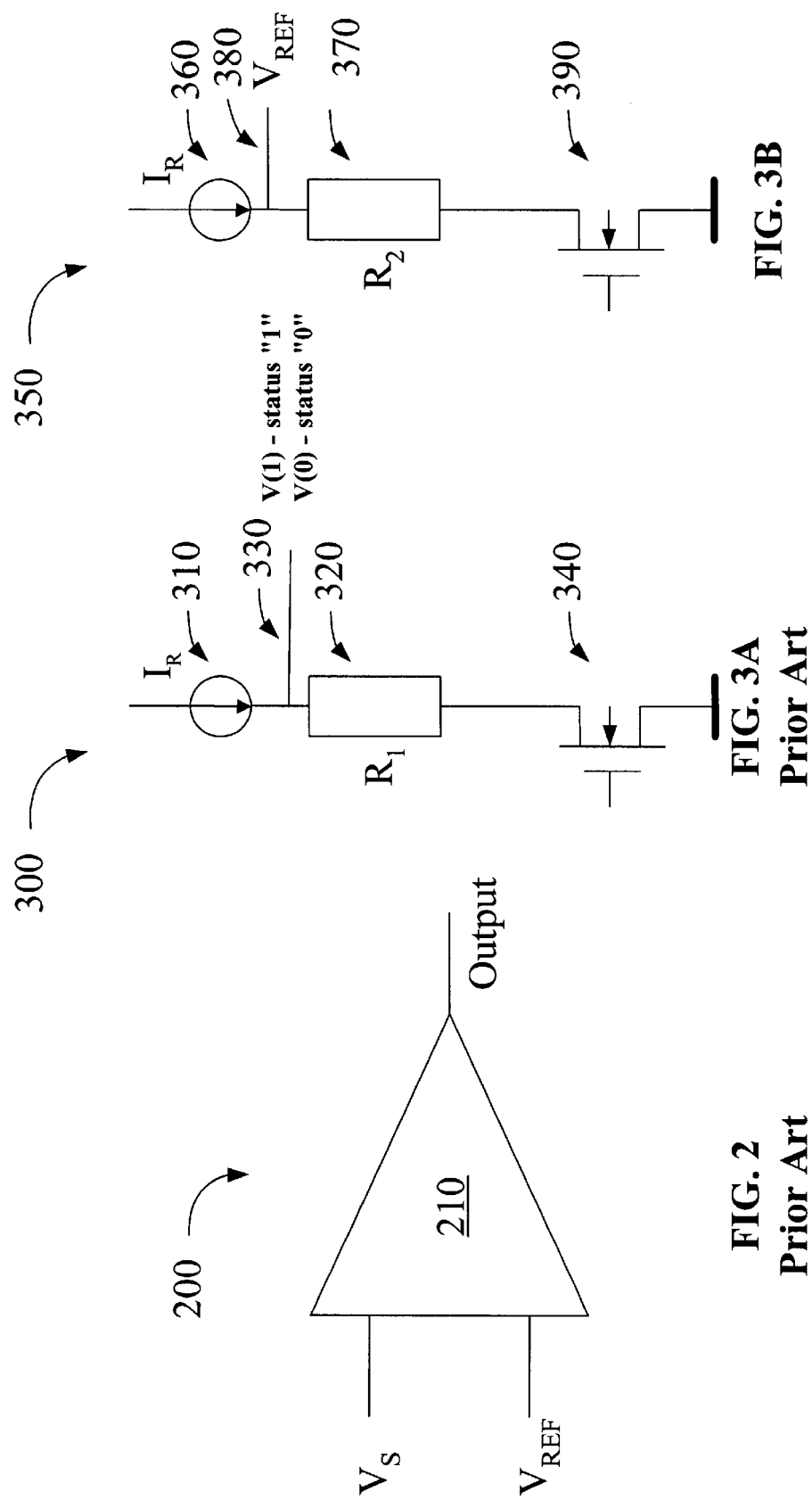

DESIGNS OF REFERENCE CELLS FOR MAGNETIC TUNNEL JUNCTION (MTJ) MRAM

CROSS-REFERENCE TO RELATED APPLICATIONS

This application is a continuation-in-part of U.S. patent application Ser. No. 10/017,647, filed Dec. 12, 2001 which claims the benefit of U.S. Provisional Application No. 60/271,169 filed Feb. 23, 2001, hereby incorporated by reference in its entirety.

BACKGROUND OF THE INVENTION

1. Field of the Invention

The present invention relates generally to data storage and more particularly to utilizing a reference cell to increase a read accuracy of memory cells from Magnetic Random Access Memory (MRAM) units.

2. Description of the Prior Art

A wide range of presently available media for data storage vary in several attributes including access speed, duration of reliable storage, and cost. Static Random Access Memory (SRAM) is the storage medium with the best access speed for the cost in applications such as cache memories. However, SRAM is volatile, meaning that it only maintains storage while power is continuously applied. Accordingly, computer users endure lengthy waits when they power-up their computers while substantial amounts of data are written from non-volatile but slow media, such as magnetic disks, into much faster random access memory (SRAM).

Flash memory has been proposed as an alternative to SRAM. Flash memory is a solid-state storage medium that provides moderate access times and is non-volatile. However, flash memory has the disadvantage that it has a limited lifetime, on the order of one million cycles per cell, after which it is no longer possible to write to a cell. This lifetime is orders of magnitude too short for a random access memory in most modern computing systems.

Another solid-state storage medium is Magnetic Random Access Memory (MRAM), which employs a Magnetic Tunnel Junction (MTJ) formed of layers of magnetic material. FIG. 1 shows a cross-section of a prior art MRAM unit 10 including an MTJ 12 formed of a pinned-layer 14 and a free-layer 16, which are magnetic layers typically formed of ferromagnetic materials, and a thin dielectric layer 18 disposed between layers 14 and 16. Pinned-layer 14 has a magnetic moment orientation 20 that is fixed from rotating, while free-layer 16 has a magnetic moment orientation 22 that is free to rotate in response to external magnetic fields. Methods of pinning a pinned-layer 14 are well known in the art and include the use of an adjacent antiferromagnetic layer (not shown).

In an MRAM unit 10, a bit of data is encoded in the direction of the magnetic moment orientation 22 of the free-layer 16 relative to the magnetic moment orientation 20 of the pinned-layer 14. As is well known in the art, when the two magnetic moment orientations 20, 22 are parallel the resistance measured across the MTJ 12 is relatively low, and when the two magnetic moment orientations 20, 22 are antiparallel the resistance measured across the MTJ 12 is relatively high. Accordingly, the relative state of the magnetic moment orientations 20, 22, either parallel or antiparallel to one another, can be determined by reading the resistance across the MTJ 12 with a read current. Typical read currents are on the order of 1–50 $\mu$A.

In an MRAM unit 10, the state of the bit, parallel or antiparallel and representing 0 or 1, for example, is varied by applying a write current $I_W$, typically on the order of 1–25 mA, through two conductors, a bit line 24 and a digit line 26, situated proximate to the MTJ 12. The intensity of the write current applied to the bit line 24 may be different than that applied to the digit line 26. The bit line 24 and the digit line 26 cross one another at right angles above and below the MTJ 12. As is well known in the art, although the pinned-layer 14 is depicted in FIG. 1 as nearer to the bit line 24, an MRAM unit 10 also functions with the pinned-layer 14 nearer to the digit line 26.

As is well known, a magnetic field develops around an electric current in a wire. Accordingly, two magnetic fields arise when write currents $I_W$ are simultaneously applied to both the bit line 24 and the digit line 26. The two magnetic fields combine at the free-layer 16 to determine the magnetic moment orientation 22. The magnetic moment orientation 22 of the free-layer 16 is made to alternate between the parallel and antiparallel states by alternating the direction of the write current $I_W$ in either the bit line 24 or the digit line 26. Alternating (by a write control circuit, not shown) the direction of the write current $I_W$ in one of the lines 24, 26 reverses the direction of the magnetic field around that conductor and thereby reverses the direction of the combined magnetic field at the free-layer 16.

In an MRAM unit 10, the state of the bit is read by passing a read current $IR$ through the MTJ 12. In these designs a transistor 30 is used to allow the read current $I_R$ to flow through the MTJ 12 during a read operation while preventing the write current $I_W$ from flowing through the MTJ 12 during a write operation.

A control signal is required to determine which direction the reversible write current $I_W$ will flow. Another control signal is required to change the state of the transistor 30 for read and write operations.

A voltage signal $V_S$ is produced by sending a read current $I_R$ through the MTJ 12. For reading an MTJ MRAM cell, the signal $V_S$ from MTJ 12 is compared with a signal $V_{REF}$ from a reference cell at a comparator 200 utilizing amplifier 210 as shown in FIG. 2.

A typical memory cell 300 as shown in FIG. 3A includes a current source 310, an MTJ device 320, an output 330 coupled to a bit line, and a MOSFET (Metal-Oxide-Semiconductor Field-Effect-Transistor) switching transistor 340. A resistance of the MTJ device 320 can either be set to a logical "0" state, resulting in a low resistance setting, R, or set to a logical "1" state, resulting in a high resistance setting, R+$\Delta$R. Consequently, the signal $V_S$ for a low resistance state is $$V_S(0)=V_{MOS}+I_R R$$

whereas the signal $V_S$ for a high resistance state is $$V_S(1)=V_{MOS}+I_R(R+\Delta R)$$

In both equations, $V_{MOS}$ is a voltage drop across a drain and a source of the MOSFET switching transistor 340. It will be understood that the MOSFET switching transistor 340 may also be of another transistor type, such as a JFET (Junction Field Effect Transistor) or bipolar transistor.

FIG. 3B shows a reference cell 350 including a current source 360, an MTJ device 370 having a resistance $R_2$, a reference output 380 coupled to a bit line, and a MOSFET switching transistor 390. To obtain the best reading performance coupled with high reliability and accuracy, an output signal $V_{REF}$ from reference cell 350 should have a median value between $V_S(1)$ and $V_S(0)$. For $V_{REF}$ to be between $V_S(1)$ and $V_S(2)$, $R_2$ would need to be between R and R+ΔR. Ideally, this leads to $$V_{REF} = V_{MOS} + I_R R_2$$

$$V_{REF} = \frac{V_s(1) + V_s(0)}{2}$$

$$V_{REF} = \frac{V_{MOS} + I_R(R + \Delta R) + V_{MOS} + I_R R}{2}$$

$$V_{REF} = \frac{2V_{MOS} + 2I_R R + I_R \Delta R}{2}$$

$$V_{REF} = V_{MOS} + I_R\left(R + \frac{\Delta R}{2}\right)$$

Therefore, the resistance $R_2$ of reference cell 350 should preferably be $$R + \frac{\Delta R}{2}.$$

Since a memory cell has a resistance of either R or R+ΔR, one approach to producing a reference cell with a resistance of $$R + \frac{\Delta R}{2}$$

is to fabricate a reference cell as if it were a memory cell with a slightly different size or shape. However, if fabrication process parameters change, the resistance of a reference cell may not change commensurately with the resistance of a memory cell. This change in the reference cell resistance may result in an inaccurate reference signal. Consequently, the possibility of read error increases (e.g., reading a logical "0" from a memory cell set to a high state (logical "1"), or vice versa) and read sensitivity (the ability to discern an actual logic state) decreases.

Accordingly, what is desired is a reference cell designed and fabricated with the same shape and size as a memory cell but arranged in such a way so as to provide a semmed effective resistance of $$R + \frac{\Delta R}{2}.$$

SUMMARY

The present invention provides for a reference cell circuit for a magnetic tunnel junction MRAM, comprising a first magnetic tunnel junction device set to a low resistance state and a second magnetic tunnel junction device set to a high resistance state. A reference cell series unit includes the first magnetic tunnel junction device electrically coupled in series with the second magnetic tunnel junction device. The reference cell series unit has a first end and a second end; the first end is electrically coupled to a first current source and the second end is electrically coupled to a current sink and a second current source.

Another embodiment of the present invention provides for a reference cell circuit for a magnetic tunnel junction MRAM comprising a first series electrical circuit and a second series electrical circuit. The first series electrical circuit includes a first magnetic tunnel junction device set to a low resistance state and a second magnetic tunnel junction device set to a high resistance state. The second magnetic tunnel junction device is electrically coupled to the first magnetic tunnel junction device in series. The second series electrical circuit includes a third magnetic tunnel junction device set to a low resistance state and a fourth magnetic tunnel junction device set to a high resistance state. The fourth magnetic tunnel junction device is electrically coupled to the third magnetic tunnel junction device in series. The first and second series electrical circuits are electrically coupled to each other in parallel.

Another embodiment of the present invention provides for a reference cell circuit for a magnetic tunnel junction MRAM comprising a first parallel electrical circuit and a second parallel electrical circuit. The first parallel electrical circuit includes a first magnetic tunnel junction device set to a low resistance state and a second magnetic tunnel junction device set to a low resistance state that is electrically coupled to the first magnetic tunnel junction device in parallel. The second parallel electrical circuit includes a third magnetic tunnel junction device set to a high resistance state and a fourth magnetic tunnel junction device set to a high resistance state that is electrically coupled to the third magnetic tunnel junction device in parallel. The first and second parallel electrical circuits are electrically coupled to each other in series.

Another embodiment of the present invention provides for a method for reading a magnetic tunnel junction MRAM cell comprising obtaining a first signal from a memory cell and obtaining a second signal from a reference cell. The reference cell includes a first magnetic tunnel junction device set to a low resistance state and a second magnetic tunnel junction device set to a high resistance state. A reference cell series unit includes the first magnetic tunnel junction device electrically coupled in series with a second magnetic tunnel junction device. The reference cell series unit has a first end and a second end; the first end is electrically coupled to a first current source, and the second end is electrically coupled to a current sink and a second current source. The first signal from the memory cell is compared with the second signal from the reference cell, and a determination of a logic state of the memory cell is based on the comparison step between the first signal and the second signal.

Another embodiment of the present invention provides for a method for reading a magnetic tunnel junction MRAM cell comprising obtaining a first signal from a memory cell and obtaining a second signal from a reference cell. The reference cell includes a first series electrical circuit and a second series electrical circuit with the first series electrical circuit having a first magnetic tunnel junction device and a second magnetic tunnel junction device electrically coupled in series. The first magnetic tunnel junction device is set to a low resistance state and the second magnetic tunnel junction device is set to a high resistance state. The second series electrical circuit has a third magnetic tunnel junction device and a fourth magnetic tunnel junction device electrically coupled in series. The third magnetic tunnel junction device is set to a low resistance state and the fourth magnetic tunnel junction device is set to a high resistance state. The first and second series electrical circuits are electrically coupled to each other in parallel. The first signal from the memory cell is compared with the second signal from the reference cell and a determination of a logic state of the memory cell is based on the comparison step between the first signal and the second signal.

Another embodiment of the present invention provides for a method for reading a magnetic tunnel junction MRAM cell comprising obtaining a first signal from a memory cell and obtaining a second signal from a reference cell. The reference cell includes a first parallel electrical circuit and a second parallel electrical circuit. The first parallel electrical circuit has a first magnetic tunnel junction device and a second magnetic tunnel junction device electrically coupled to each other in parallel. The first magnetic tunnel junction device and the second magnetic tunnel junction device are each set to a low resistance state. The second parallel electrical circuit has a third magnetic tunnel junction device and a fourth magnetic tunnel junction device electrically coupled to each other in parallel. The third magnetic tunnel junction device set and the fourth magnetic tunnel junction device are each set to a high resistance state. The first and second parallel electrical circuits are electrically coupled to each other in series. The first signal from the memory cell is compared with the second signal from the reference cell and a determination of a logic state of the memory cell is based on the comparison step between the first signal and the second signal.

Another embodiment of the present invention provides for a method for reading a magnetic tunnel junction MRAM cell comprising obtaining a first signal from a memory cell in a first-half of a circuit, obtaining a reference signal from a reference cell in a second-half of a circuit, and comparing the first signal from the memory cell with the reference signal from the reference cell, and determining a logic state of the memory cell based on the comparison step between the first signal and the reference signal.

Another embodiment of the present invention provides for a memory block cell layout comprising an amplifier/comparator, a plurality of memory cells with the memory cells sorted into columns and rows, a plurality of reference cells with the plurality of reference cells occurring in pairs for each row of the memory cells including a left-half reference cell and a right-half reference cell for each row of the memory cells. The plurality of reference cells and the plurality of memory cells are further divided into a plurality of left-half reference cells, a plurality of left-half memory cells, a plurality of right-half reference cells, and a plurality of right-half memory cells. The plurality of left-half reference cells and the plurality of left-half memory cells are electrically coupled to a first input lead of the amplifier/comparator and the plurality of right-half reference cells and the plurality of right-half memory cells are electrically coupled to a second input lead of the amplifier/comparator. The first input lead and the second input lead are always coupled to receive and accept both a memory cell input from the plurality of memory cells located in a first-half of the memory block and a reference cell input from the plurality of reference cells located in a second-half of the memory block.

Another embodiment of the present invention provides for a reference cell circuit for a magnetic tunnel junction MRAM comprising n-strings of magnetic tunnel junction devices with each of the n-strings including a first plurality of an integral number of about $$\frac{n}{2}$$

magnetic tunnel junction devices electrically coupled in series with each other and a second plurality of an integral number of about $$\frac{n}{2}$$

magnetic tunnel junction devices electrically coupled in series with each other and with the first plurality of magnetic tunnel junction devices. The first plurality of magnetic tunnel junction devices is set to a low resistance state and the second plurality of magnetic tunnel junction devices is set to a high resistance state. The n-strings of magnetic tunnel junction devices are coupled in parallel with each other such that a summed resistance across the reference cell circuit is about $$R + \frac{\Delta R}{2}$$

ohms.

Another embodiment of the present invention provides for a reference cell circuit for a magnetic tunnel junction MRAM comprising a first parallel electrical circuit and a second parallel electrical circuit. The first parallel circuit includes n-strings of magnetic tunnel junction devices; each of the n-strings has a first plurality of an integral number of about $$\frac{n}{2}$$

magnetic tunnel junction devices electrically coupled in series with each other. The first plurality of magnetic tunnel junction devices are each set to a low resistance state. The second parallel circuit includes n-strings of magnetic tunnel junction devices; each of the n-strings has a second plurality of an integral number of about $$\frac{n}{2}$$

magnetic tunnel junction devices electrically coupled in series with each other. The second plurality of magnetic tunnel junction devices are each set to a high resistance state. The first and second parallel electrical circuits are electrically coupled in series with each other such that a summed resistance across the reference cell circuit is about $$R + \frac{\Delta R}{2}$$

ohms.

Another embodiment of the present invention provides for a reference cell circuit for a magnetic tunnel junction MRAM comprising a means for electrically coupling a plurality of magnetic tunnel junction devices so as to produce a summed resistance across the electrically coupled plurality of magnetic tunnel junction devices of about $$R + \frac{\Delta R}{2}$$

ohms.

Another embodiment of the present invention provides for a memory device comprising at least one memory cell utilizing a magnetic tunnel junction MRAM and at least one reference cell associated with and electrically coupled to the memory cell. The reference cell has an effective resistance of about $$R + \frac{\Delta R}{2}$$

ohms.

BRIEF DESCRIPTION OF DRAWINGS

The present invention is illustrated by way of example, and not by way of limitation, in the figures of the accompanying drawings where like reference numerals frequently refer to similar elements and in which:

FIG. 2 is a signal comparison and amplification circuit of the prior art;

FIG. 3A is a typical memory cell of the prior art;

FIG. 3B is a reference cell;

DETAILED DESCRIPTION OF THE INVENTION

In order to overcome limitations of the prior art, several embodiments are described below that allow reference cells to be implemented using the same design and dimensions as memory cells found in proximity to the reference cell. By using a standard memory cell geometry for both memory cells and reference cells, the reference cell will serve the intended purpose without potential changes in resistance arising from fabrication process parameter variations.

Figure 4:
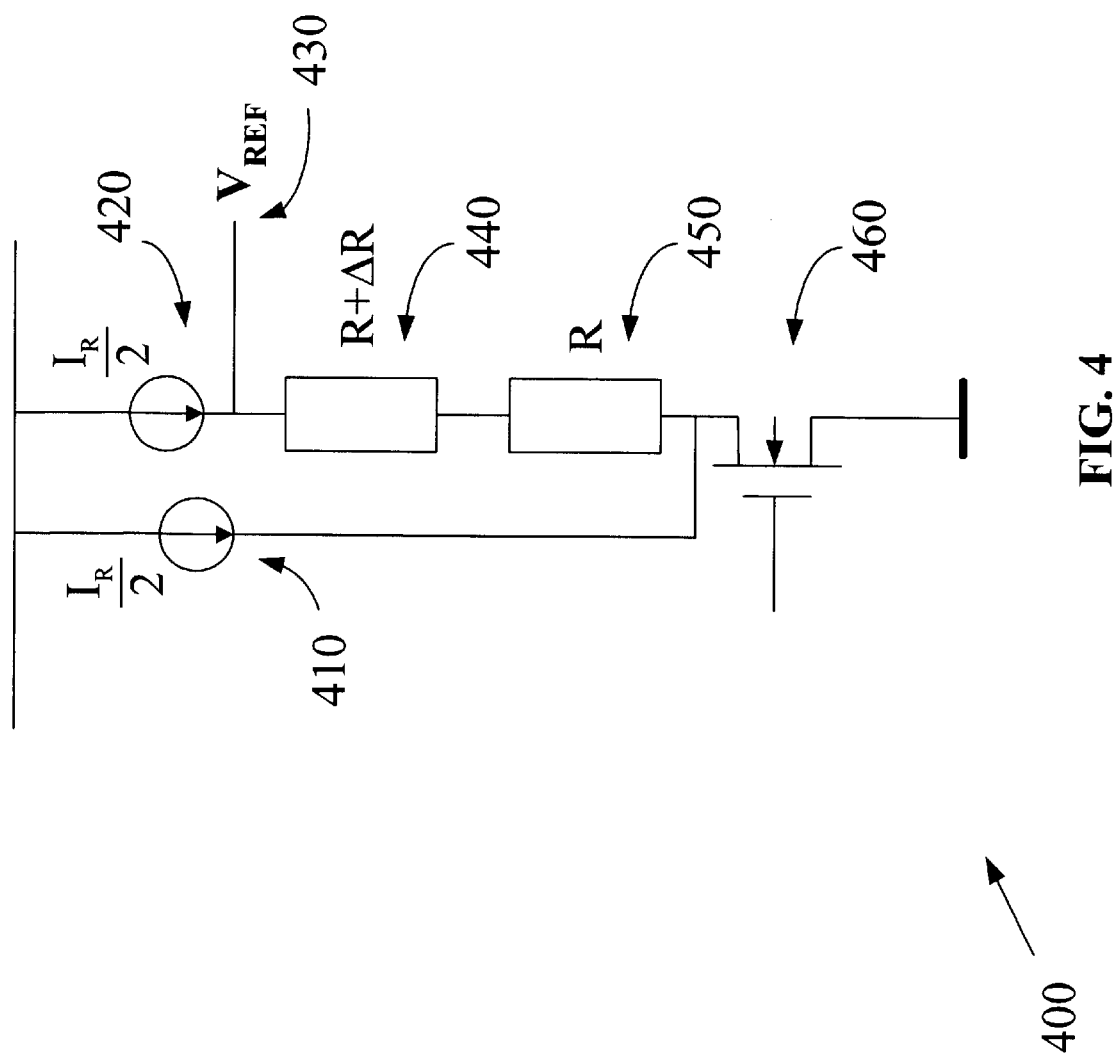
FIG. 4 is a reference cell of the present invention.

FIG. 4 shows a reference cell 400 in accordance with one embodiment of the present invention. Reference cell 400 includes a first current source 410, a second current source 420, a reference voltage measurement point 430, a first MTJ device 440, a second MTJ device 450, and a MOSFET transistor 460. Reference cell 400 shows the first and second MTJ device 440, 450 connected in series with the MOSFET transistor 460, the MOSFET transistor 460 acting as a simple transistor switch. MOSFET transistor 460 is designed to be physically the same and have the same electrical performance as MOSFET switching transistor 340 (FIG. 3A) in any memory cell 300. The design of the first and second MTJ devices is the same as any memory cells contained in a nearby circuit. The first MTJ device 440 is programmed as a logical "1", or to a high resistance setting R+ΔR; while the second MTJ device 450 is programmed as a logical "0", or to a low resistance setting R. The summed resistance of serially connected first and second MTJ devices is 2R+ΔR, serving as effective reference resistance $R_2$ of the MTJ device 370 (FIG. 3B).

When a cell is read, a current is applied to the reference cell 400 by the first current source 410 that is approximately one-half the amount of current, $I_R$, applied to a memory cell 300 by current source 310 (FIG. 3A). Another one-half of the current, $I_R$, is applied from the second current source 420 to the MOSFET transistor 460 at its drain. Hence, the current applied by either the first current source 410 or the second current source 420 is $$\frac{I_R}{2}.$$

By using one-half the amount of current applied to two points in the reference cell 400 circuit, a voltage drop across the MOSFET transistor 460 in the reference cell 400 is equivalent to a voltage drop occurring across the MOSFET switching transistor 340 in a memory cell 300. As is well known in the art, a proportional current source can be easily obtained by means of a MOSFET mirror current source.

Reference signal $V_{REF}$, as measured from reference cell measurement point 430 to a source of MOSFET transistor 460, is determined from the following equations $$V_{REF} = V_{MOS} + \frac{I_R}{2}(2R + \Delta R)$$

$$V_{REF} = V_{MOS} + I_R\left(R + \frac{\Delta R}{2}\right)$$

Therefore, the equivalent resistance of this configuration is $$R + \frac{\Delta R}{2},$$

which is the same as resistance $R_2$ through an ideal MTJ device 370 (FIG. 3B).

Figure 5:
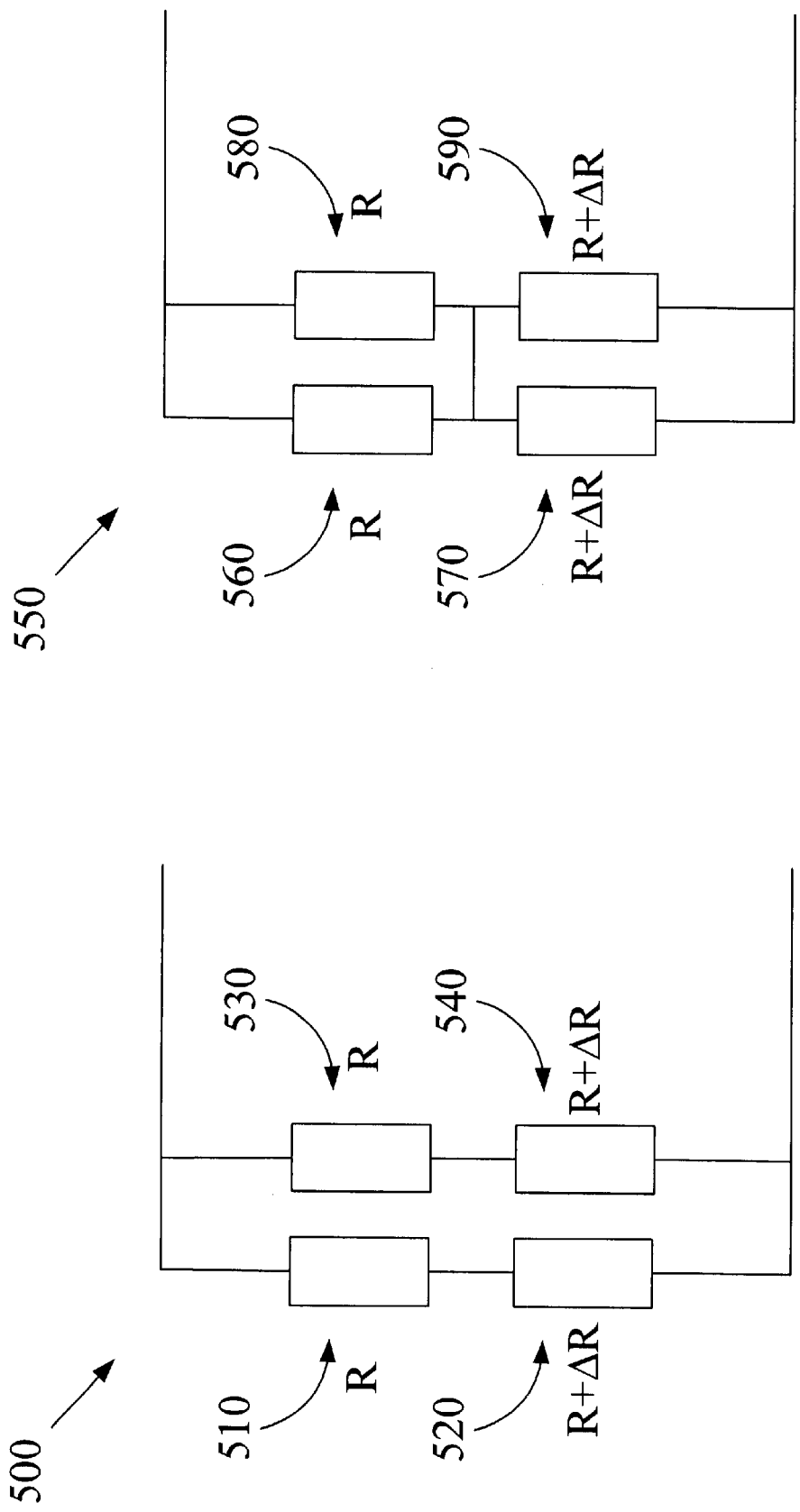
FIG. 5A is a reference cell section of the present invention.
FIG. 5B is a reference cell section of the present invention.

FIG. 5A shows another reference cell segment 500 in accordance with another embodiment of the present invention. Reference cell segment 500 includes a first MTJ device 510, a second MTJ device 520, a third MTJ device 530, and a fourth MTJ device 540, each having the same design and dimensions as a memory cell. First and second MTJ devices 510, 520 are connected with each other in a series circuit and form a first branch of a parallel circuit. Similarly, third and fourth MTJ devices 530, 540 are also connected in series with each other and form a second branch of the parallel circuit. The first and third MTJ devices 510, 530 are each programmed to a logical "0" state, or a low resistance setting R. The second and fourth MTJ devices 520, 540 are each programmed to a logical "1" state, or a high resistance setting R+ΔR. When the first and second branches are combined to form a parallel circuit as shown in FIG. 5A, the equivalent resistance $R_{eq,A}$, is $$R_{eq,A} = \frac{(2R + \Delta R) \cdot (2R + \Delta R)}{(2R + \Delta R) + (2R + \Delta R)}$$

$$R_{eq,A} = \frac{2R + \Delta R}{2}$$

$$R_{eq,A} = R + \frac{\Delta R}{2}$$

thereby still arriving at an ideal resistance value equivalent to $R_2$ while utilizing standard MTJ device designs.

FIG. 5B shows another reference cell segment 550 in accordance with another embodiment of the present invention. Reference cell 550 includes a first MTJ device 560, a second MTJ device 570, a third MTJ device 580, and a fourth MTJ device 590, each having the same design and dimensions as a memory cell. First and third MTJ devices 560, 580 are connected with each other in a parallel circuit and form a first part of a series circuit. Similarly, second and fourth MTJ devices 570, 590 are also connected in parallel with each other and form a second part of the series circuit. The first and third MTJ devices 560, 580 are each programmed to a logical "0" state, or a low resistance setting R. The second and fourth MTJ devices 570, 590 are each programmed to a logical "1" state, or a high resistance setting R+ΔR. When the first and second branches are combined to form a series circuit as shown in FIG. 5B, the equivalent resistance $R_{eq,B}$ is $$R_{eq,B} = \frac{R \cdot R}{R + R} + \frac{(R + \Delta R) \cdot (R + \Delta R)}{(R + \Delta R) + (R + \Delta R)}$$

$$R_{eq,B} = \frac{2R + \Delta R}{2}$$

$$R_{eq,B} = R + \frac{\Delta R}{2}$$

The equivalent resistance, $R_{eq,B}$, of reference cell segment 550 therefore also produces the ideal resistance value of $R_2$.

It can be seen that reference cell segments 500, 550 are structurally different but yield the same equivalent resistance of $$R + \frac{\Delta R}{2}.$$

Therefore, reference cell segments 500 or 550 can be substituted for $R_2$ 360 of FIG. 3B while still allowing all MTJ devices 510–540 or 560–590 to be designed and fabricated in the same fashion as any memory cells in a nearby circuit.

One of ordinary skill in the art can readily envision other permutations of the circuits described in FIGS. 5A and 5B that make use of a plurality of MTJ devices. For example, a circuit (not shown) expanding on that shown in FIG. 5A could be fashioned utilizing an n×n array of MTJ devices, where n is an even integer number. In this embodiment, a total resistance, in ohms, of n MTJ devices connected in series would be $$nR + \frac{n}{2}\Delta R$$

assuming there is an equal number of MTJ devices programmed to either a high or low resistance setting. Utilizing n MTJ devices in series forms one branch of a parallel circuit. Connecting n branches in parallel with each other, wherein each branch is formed of n MTJ devices connected in series and programmed as stated produces a total equivalent resistance of $$\frac{nR + \frac{n}{2}(\Delta R)}{n} = R + \frac{\Delta R}{2}$$

The foregoing embodiment assumes an even number of MTJ devices with equal numbers of MTJ devices programmed to either a high or low resistance setting. One skilled in the art can readily envision a series-parallel circuit similar to that outlined above but utilizing an m×m array of MTJ devices. In this embodiment, m is any odd integer number greater than 2. For an odd number of MTJ devices, $$\frac{m}{2} \pm 0.5$$

MTJ devices would be set to a high resistance setting while the remaining $$\frac{m}{2} \mp 0.5$$

MTJ devices would be set to a low resistance setting. The symbols "±" and "∓" are used to indicate that non-integer values (non-integer values occurring due to dividing an odd integer value by 2) are alternatively rounded up or down by 0.5 to arrive at the next integer value. If a non-integer value is rounded up by 0.5, then the same non-integer value is next rounded down by 0.5. For example, if m has a value of 25, then 13 MTJ devices would be programmed to a high resistance setting and 12 MTJ devices would be programmed to a low resistance setting. In this embodiment, a total resistance, in ohms, of m MTJ devices connected in series would be $$(m \pm 0.5) \cdot R + \left(\frac{m \mp 0.5}{2}\right) \cdot \Delta R$$

Utilizing m MTJ devices in series forms one branch of a parallel circuit. Connecting m branches in parallel with each other, wherein each branch is formed of m MTJ devices connected in series and programmed as stated produces a total equivalent resistance of $$\frac{(m \pm 0.5) \cdot R + \left(\frac{m \mp 0.5}{2}\right) \cdot \Delta R}{m} \cong R + \frac{\Delta R}{2}$$

For values of m>>3, the approximate nature of the previous equation asymptotically approaches an equality.

Those skilled in the art will quickly recognize that the aforementioned embodiments encompassing a plurality of MTJ devices may be applied in a similar fashion to FIG. 5B as well.

Figure 6:
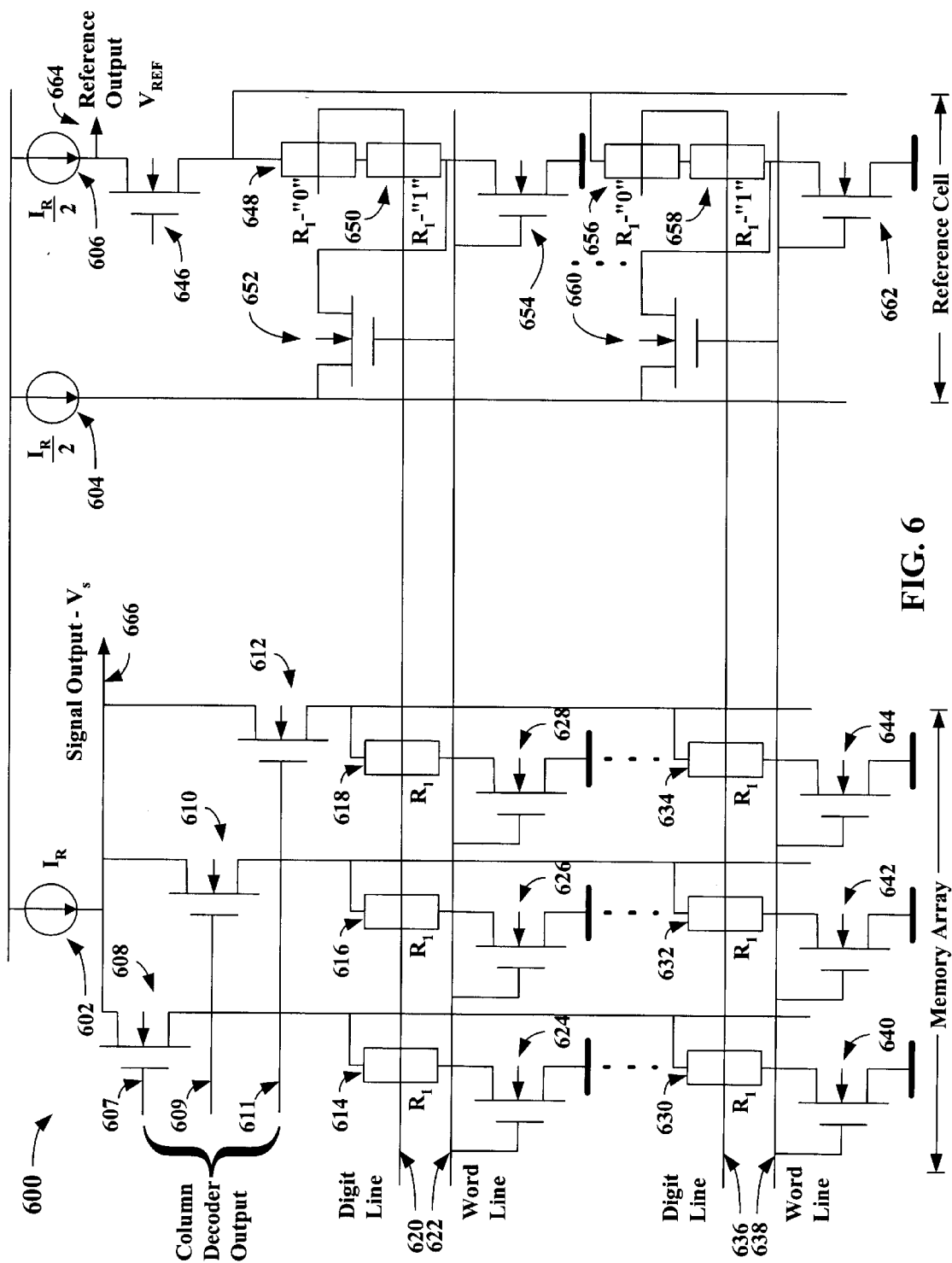
FIG. 6 is a memory block implementing a reference cell of the present invention as shown in FIG. 4.

FIG. 6 shows an embodiment of an implementation of memory block 600 utilizing a reference cell 400 as described in conjunction with FIG. 4. FIG. 6 includes current sources 602–606, column decoder outputs 607, 609, 611, MOSFET transistors 608, 610, 612, 646, 652, 660, MTJ devices 614–618, 630–634, digit lines 620, 636, word lines 622, 638, MOSFET switching transistors 624–628, 640–644, 654, 662, MTJ devices programmed to a low resistivity setting 648, 656, MTJ devices programmed to a high resistivity setting 650, 658, a reference voltage output tap 664, and a signal voltage output tap 666. In this embodiment of a memory block 600, each line in an array of MTJ devices 614–618, 630–634 has an associated reference cell. One reference cell 400 (FIG. 4) is comprised of current sources 604, 606, MOSFET transistors 646, 652, MOSFET switching transistor 654, an MTJ device programmed to a low resistivity setting 648, and an MTJ device programmed to a high resistivity setting 650. Notice that the current sources 604, 606 associated with the reference cells each supply about half the current level to the reference cells as compared with the amount of current supplied to the memory cells through current source 602.

The circuit functions in the following way. Whenever a read request is sent, a read current directed to a given MTJ device 614–618, 630–634 in the memory array 600 and produces a voltage, $V_S$, at the signal voltage output tap 666. Concurrently, a read current directed to an associated reference cell produces a reference voltage, $V_{REF}$, at the reference voltage output tap 664. $V_S$ and $V_{REF}$ are compared in a comparator 200 (FIG. 2). If $V_S$ is greater than $V_{REF}$, the state of the memory cell is determined to be a logical "1." If $V_S$ is less than $V_{REF}$, the state of the memory cell is determined to be a logical "0." The memory block 600 may be made any size by repeating the number of lines and columns. For improving read efficiency and accuracy, each memory cell line should have at least one associated reference cell.

Figure 7:
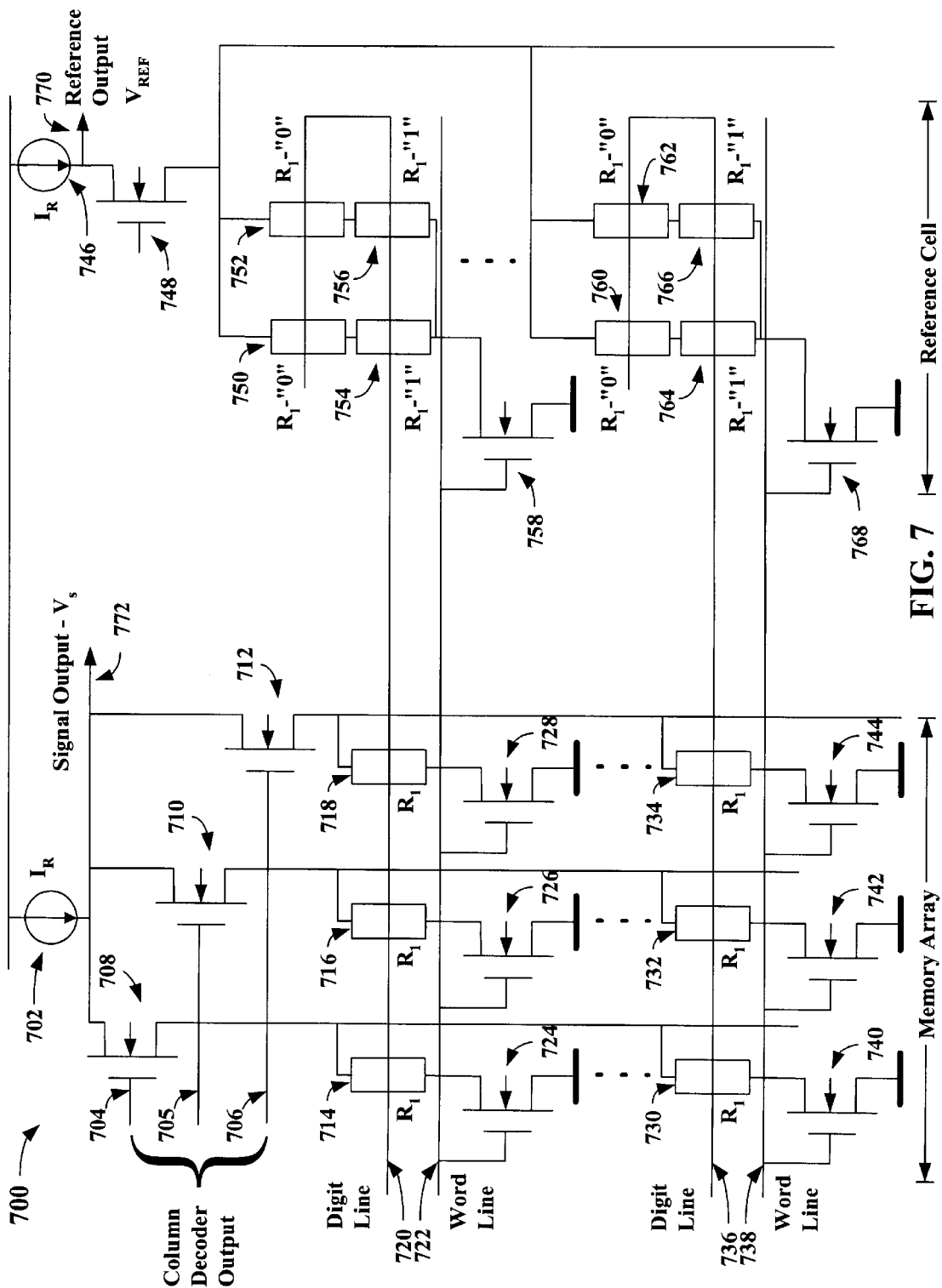
FIG. 7 is a memory block implementing a reference cell of the present invention as shown in FIG. 4.

FIG. 7 shows an embodiment of an implementation of memory block 700 utilizing a reference cell 500 as described in conjunction with FIG. 5A. FIG. 7 includes current sources 702, 746, column decoder outputs 704–706, MOSFET transistors 708, 710, 712, 748, MTJ devices 714–718, 730–734, digit lines 720, 736, word lines 722, 738, MOSFET switching transistors 724–728, 740–744, 758, 768, MTJ devices programmed to a low resistivity setting 750, 752, 760, 762, MTJ devices programmed to a high resistivity setting 754, 756, 764, 766, a reference voltage output tap 770, and a signal voltage output tap 772. In this embodiment of a memory block 700, each line in an array of MTJ devices 714–718, 730–734 has an associated reference cell 500. Therefore, whenever a read request is sent, a read current is directed to a given MTJ device 714–718, 730–734 in the memory array to produce a voltage signal, $V_S$, at the signal voltage output tap 772. Concurrently, a read current is directed to an associated reference cell section 500 produces a reference voltage, $V_{REF}$, at the reference voltage output tap 770. $V_S$ and $V_{REF}$ are compared in a comparator 200 (FIG. 2). If $V_S$ is greater than. $V_{REF}$, the state of the memory cell is determined to be a logical "1." If $V_S$ is less than $V_{REF}$, the state of the memory cell is determined to be a logical "0." The memory block 700 may be made any size by repeating the number of lines and columns. For improving read efficiency and accuracy, each memory cell line should have at least one associated reference cell 500. A similar embodiment may be envisioned utilizing the reference cell segment 550 of FIG. 5B.

Figure 8:
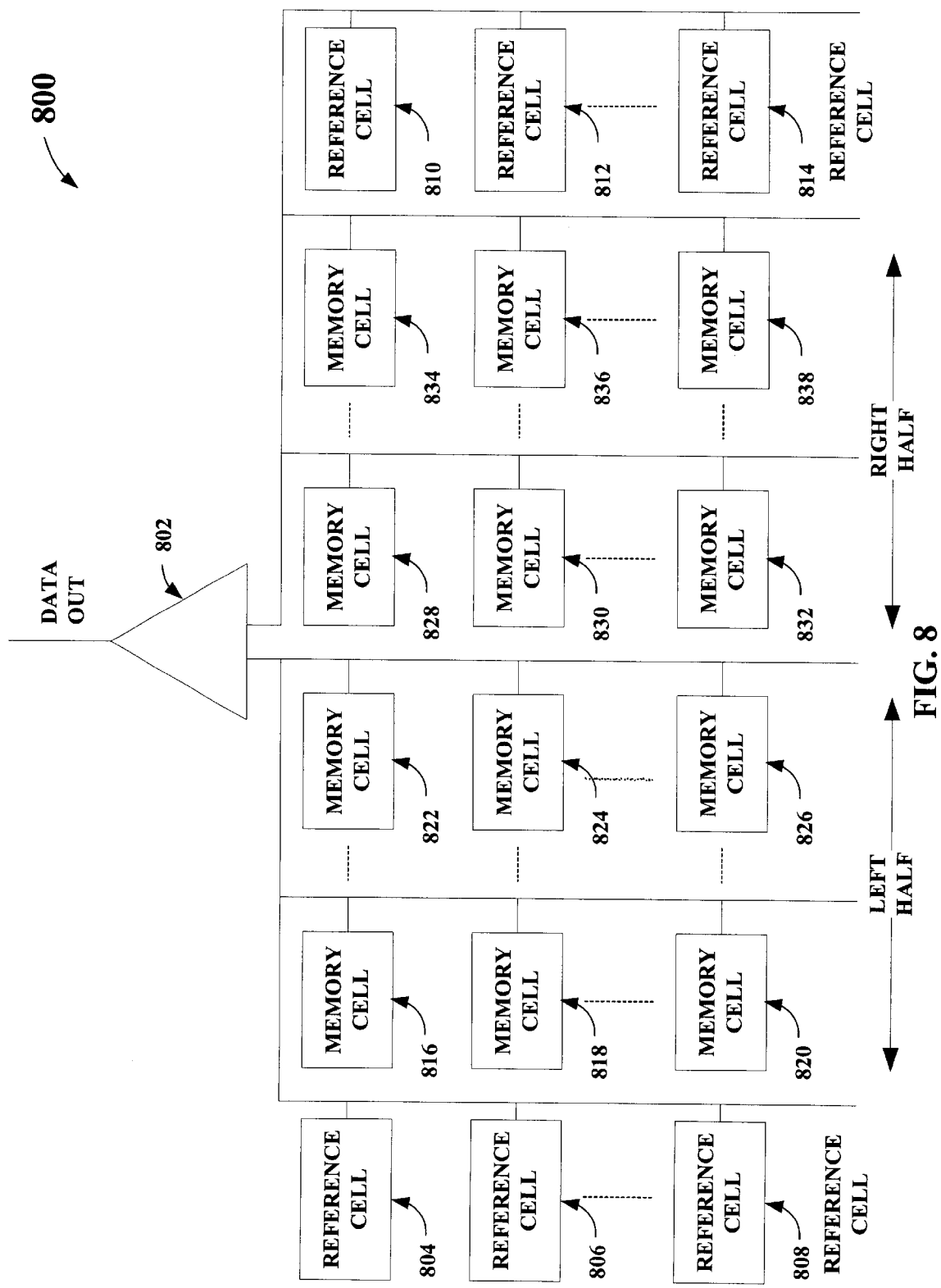
FIG. 8 is an embodiment of a cell layout implementing a reference cell of the present invention.

FIG. 8 is an embodiment of a cell layout 800 using reference cells 804–814 of the present invention. Cell layout 800 includes an amplifier/comparator 802, reference cells 804–814, and memory cells 816–838. In the embodiment shown in FIG. 8, every row in a memory array has two reference cells, located in a right-most and a left-most position. For a memory block, two reference columns are included as part of the block design. However, the two reference columns need not necessarily be located at the right-most and left-most column positions. A reference column may be at any column position in one-half of the memory array and another reference column may be at any column position in another half of the memory array. As shown in FIG. 2, a voltage signal, $V_{REF}$, from a reference cell 804–814 is always compared with a read signal, $V_S$, from a memory cell 816–838. In FIG. 8, when a memory cell 816–826 in a left-half of a memory block row is read, a reference cell 810–814 from a right-half of the memory block row is also selected for comparison. Similarly, when a memory cell 828–838 from the right-half of a memory block is read, a reference cell 804–808 from the left-half is selected for comparison. By this means, the memory block only needs one amplifier/comparator 802 for the read operation. Memory blocks of any size may be implemented by the same basic structure shown in FIG. 8 by increasing the number of lines and/or columns.

In the embodiments described herein, because the MTJ devices used in reference cells are designed similarly to the MTJ devices used in memory cells, variations in designs or processes will cause the resistance of all cells to change in a similar way.

Figure 9:
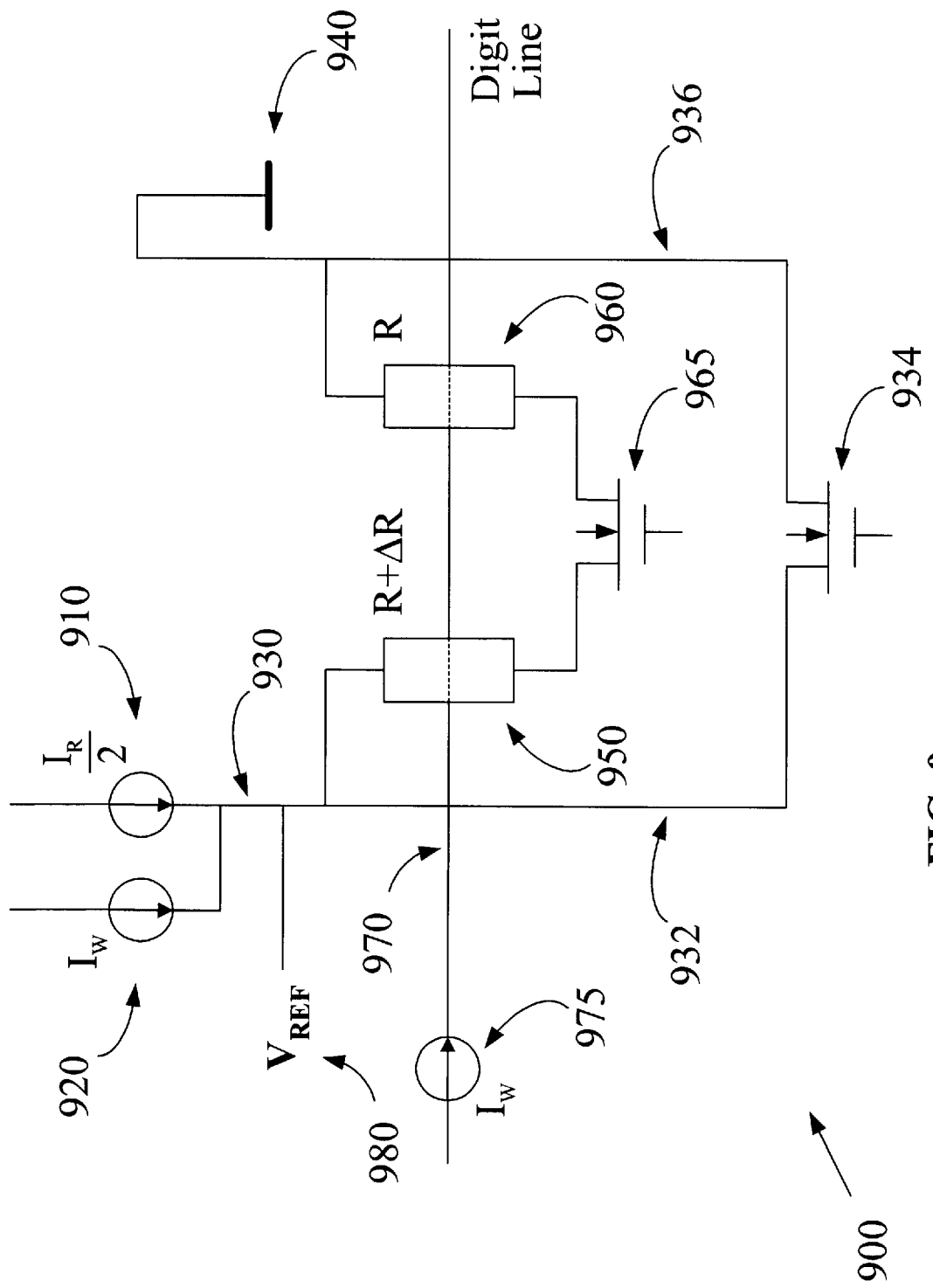
FIG. 9 is a reference cell of the present invention.

FIG. 9 shows of a reference cell 900 in accordance with still another embodiment of the present invention. Reference cell 900 includes a read current source 910 and a write current source 920 connected to a first end of a bit line 930. Bit line 930 includes two portions, a first bit line portion 932 extending from the first end to a MOSFET transistor 934, and a second bit line portion 936 extending from the MOSFET transistor 934 to a current sink 940 at a second end.

Reference cell 900 also includes a first MTJ device 950 and a second MTJ device 960. First and second MTJ devices 950, 960 are disposed proximate to first and second bit line portions 932 and 936, respectively, and are further connected in series between the first and second bit line portions 932, 936 by another MOSFET transistor 965.

Reference cell 900 further includes a digit line 970 that is disposed proximate to the first and second MTJ devices 950, 960 but that is not electrically connected to any other components of the reference cell 900. A second write current source 975 is connected to an end of the digit line 970. During a write operation the write current source 920 produces a write current $I_W$ that flows through the bit line 930 and the second write current source 975 also produces a write current $I_W$ that flows through the digit line 970. As noted previously with respect to MRAM unit 10, the magnitudes of the write currents $I_W$ produced by write current sources 920 and 975 may be different. During the write operation the MOSFET transistor 934 is turned on to allow the write current $I_W$ to flow from the first bit line portion 932 to the second bit line portion 936, while the MOSFET transistor 965 is turned off to prevent the write current $I_W$ from flowing through the MTJ devices 950, 960.

Importantly, during a write operation the write current $I_W$ in the bit line portions 932, 936 flows past the MTJ devices 950, 960 in opposite directions. At the same time, the write current $I_W$ in the digit line 970 flows past the MTJ devices 950, 960 in the same direction. It will be appreciated that during a write operation, regardless of the directions of flow of the write currents in the bit and digit lines 930, 970, one MTJ device 950 or 960 will always be induced to be in the high resistance state (R+ΔR) while the other MTJ device 960 or 950 will always be induced to be in the low resistance state (R).

During a read operation the read current source 910 produces a read current that flows through the bit line 930. During the read operation the MOSFET transistor 934 is turned off while the MOSFET transistor 965 is turned on to direct the read current through the MTJ devices 950, 960. The MTJ devices 950 and 960 each remain in opposite states, one in the high resistance state and the other in the low resistance state. The combined resistance measured over MTJ devices 950 and 960 will therefore always be the sum of the high and low resistance states, namely 2R+ΔR, and the voltage drop over MTJ devices 950 and 960 will be $$\frac{I_R}{2}(2R+\Delta R).$$

Figure 10:
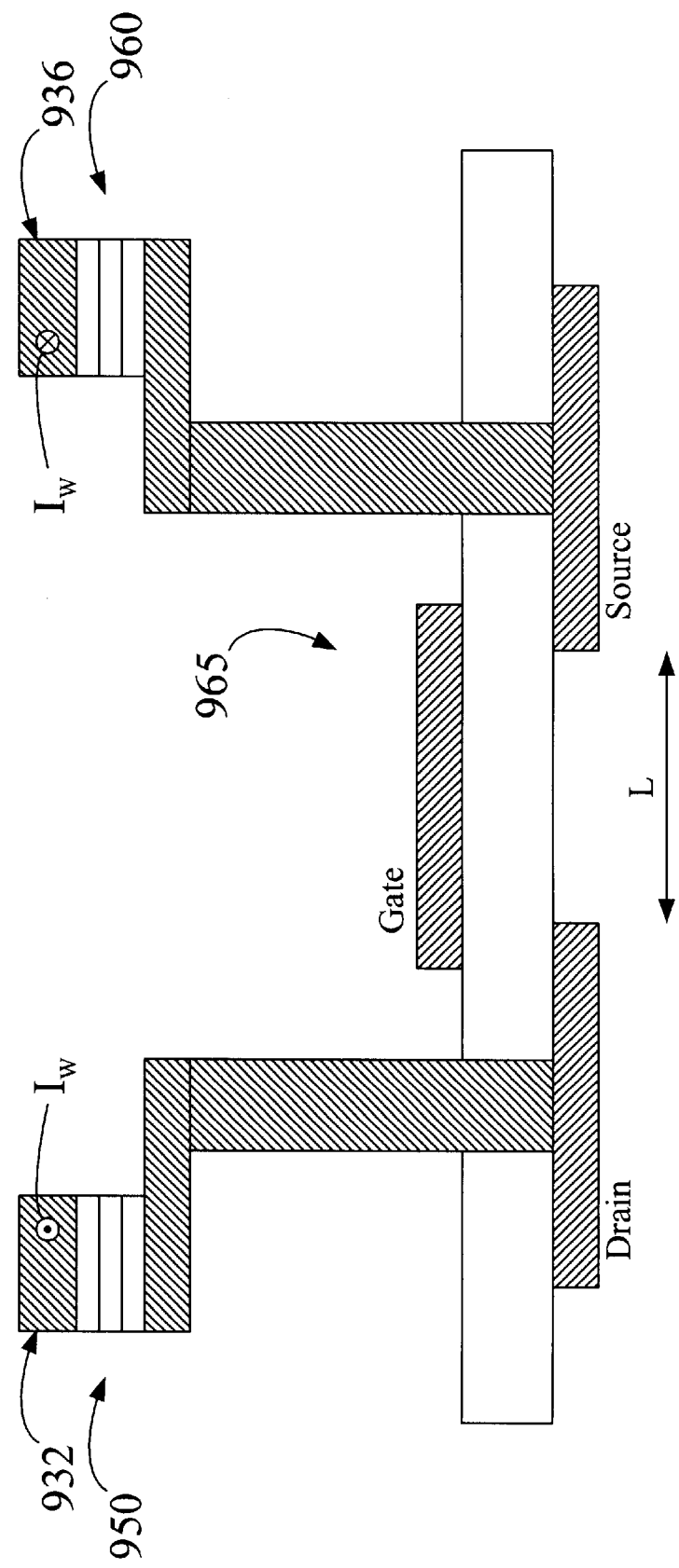
FIG. 10 is a cross-sectional representation of the reference cell of FIG. 9.

FIG. 10 shows a cross-section through a portion of the reference cell 900 shown in FIG. 9. As indicated, the write current $I_W$ in the first bit line portion 932 flows in an opposite direction from a direction of flow of the write current $I_W$ in the second bit line portion 936. From FIGS. 9 and 10 it can be seen that, if the MOSFET transistor 965 is in a conducting state, the reference signal $V_{REF}$, measured from the reference point 980 to the current sink 940 will be measured across both MTJ devices 950 and 960 and the MOSFET transistor 965 so that $$V_{REF} = V_{MOS} + \frac{I_R}{2}(2R+\Delta R)$$

$$V_{REF} = V_{MOS} + I_R\left(R + \frac{\Delta R}{2}\right)$$

Therefore, in order for $V_{REF}$ to fall between $V_S(0)$ and $V_S(1)$, $V_{MOS}$ for the MOSFET transistor 965 needs to be the same as $V_{MOS}$ for a transistor in a memory cell being read. It is well known that a transistor's current is proportional to the voltage between the source and drain when the transistor is operating below saturation in a linear region, and since a read current $$\frac{I_R}{2}$$

is applied to MOSFET transistor 965 the $V_{MOS}$ for the MOSFET transistor 965 will be half of the $V_{MOS}$ for the transistor of the memory cell being read, all else being equal. However, $V_{MOS}$ is also inversely proportional to the ratio $$\frac{W}{L}$$

where L is the channel length of the transistor and W is the width of the transistor measured perpendicular to the plane of the drawing in FIG. 10. Consequently, $V_{MOS}$ for the MOSFET transistor 965 can be made to be the same as $V_{MOS}$ for the transistor of the memory cell being read by engineering the ratio $$\frac{W}{L}$$

for the MOSFET transistor 965 to be half the ratio of the transistor of the memory cell being read. Put another way, halving the ratio $$\frac{W}{L}$$

for the MOSFET transistor 965 counteracts the effect of using a read current of $$\frac{I_R}{2}.$$

Figure 1:
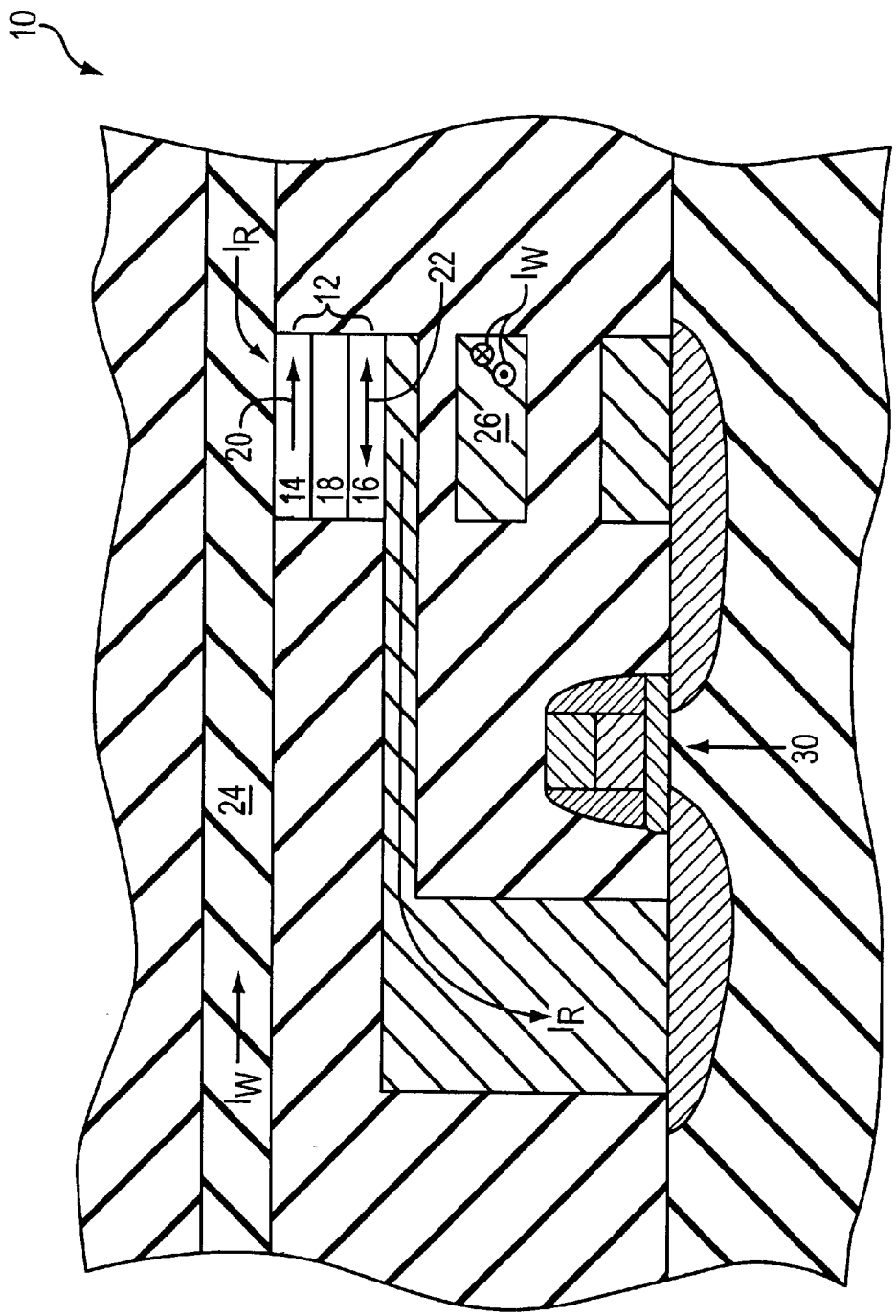
FIG. 1 is a cross-sectional representation of an MRAM of the prior art.
Figure 11:
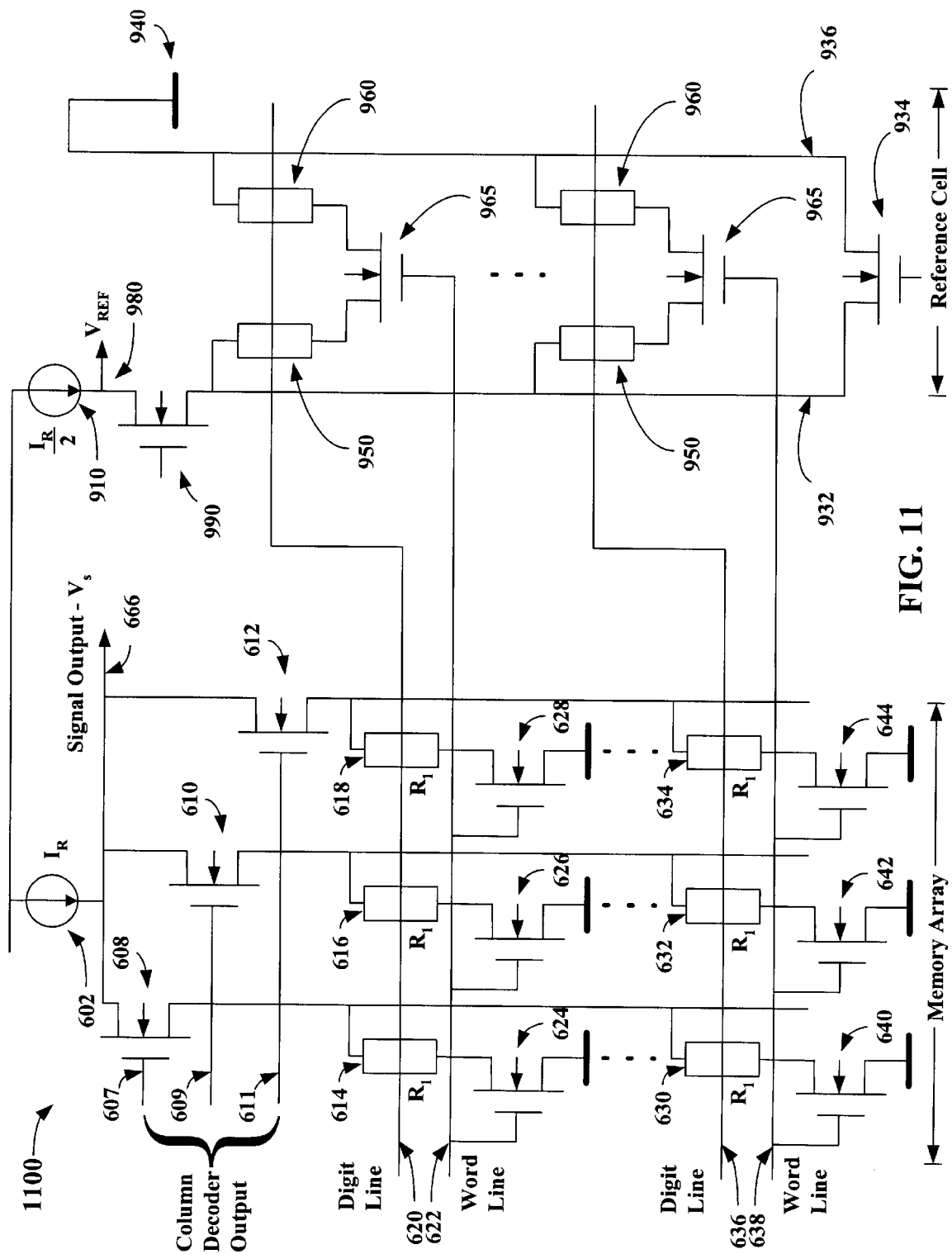
FIG. 11 is a memory block implementing a reference cell of the present invention as shown in FIG. 9.

FIG. 1 shows an embodiment of an implementation of memory block 1100 utilizing a reference cell 900 as described in conjunction with FIG. 9. For simplicity, the write current sources 920 and 975 shown in FIG. 9 have been omitted. An additional MOSFET transistor 990 is present in FIG. 11 preferably between the reference point 980 and the first reference cell, though it could also be placed just before current sink 940. During a read operation the MOSFET transistor 990 adds an additional voltage drop to the total voltage drop measured between the reference point 980 and the current sink 940. By engineering the ratio $$\frac{W}{L}$$

for MOSFET transistor 990 to be half of that for MOSFET transistors 608, 610, and 612, as described above, the voltage drop across MOSFET transistor 990 can be made to equal the voltage drop across the MOSFET transistor 608, 610, or 612 of a particular selected column.

Figure 12:
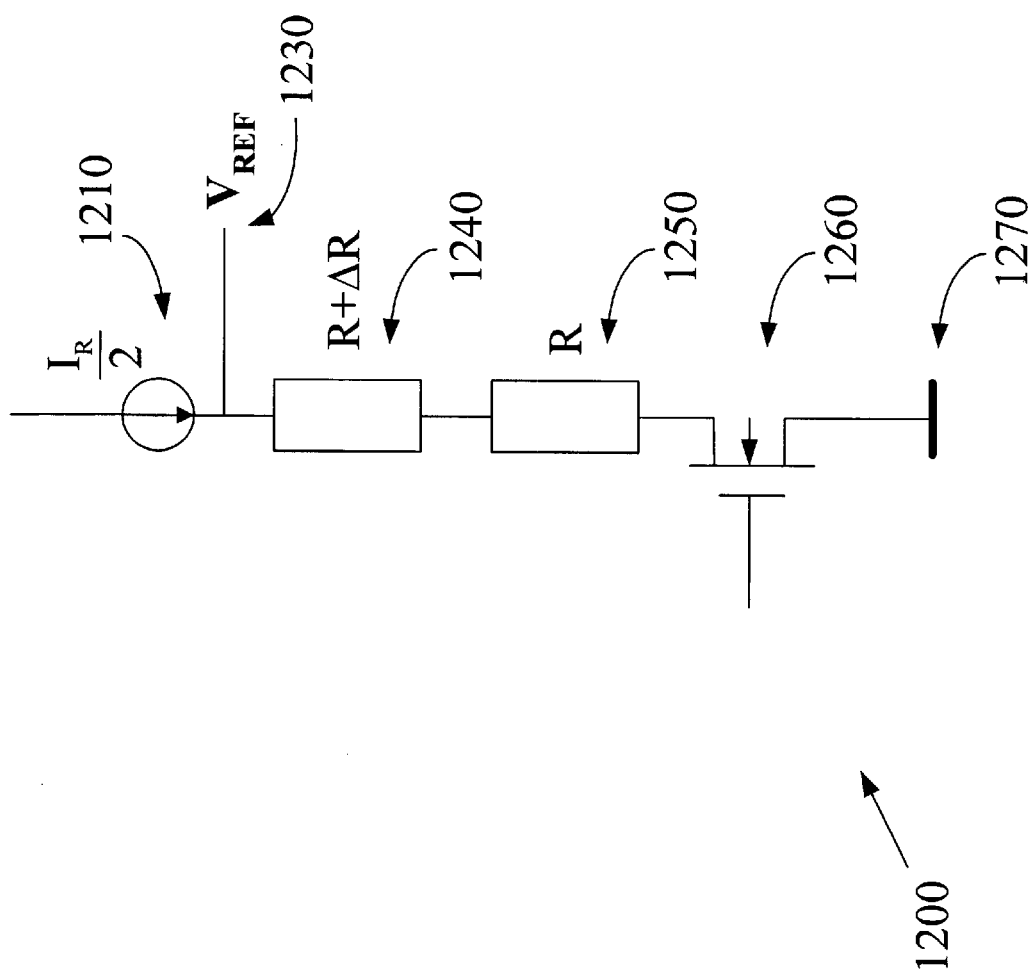
FIG. 12 is a reference cell of the present invention.

FIG. 12 shows a reference cell 1200 in accordance with yet another embodiment of the present invention. Reference cell 1200 includes a current source 1210, a reference voltage measurement point 1230, a first MTJ device 1240, a second MTJ device 1250, a MOSFET transistor 1260, and a current sink 1270. In reference cell 1200 the first and second MTJ devices 1240, 1250 and the MOSFET transistor 1260 are arranged in a series circuit, in any order, between the current sink 1270 and the read current source 1210. The design of the first and second MTJ devices 1240, 1250 is the same as any memory cells contained in a nearby circuit. The first MTJ device 1240 is programmed as a logical "1", or to a high resistance setting R+ΔR; while the second MTJ device 1250 is programmed as a logical "0", or to a low resistance setting R. accordingly, the summed resistance across serially connected first and second MTJ devices 1240, 1250 is 2R+ΔR.

While the embodiment shown in FIG. 12 is similar to the embodiment shown in FIG. 4, in FIG. 12 the current source 410 is eliminated. To compensate for the missing current source 410 the MOSFET transistor 1260 is designed such that the ratio $$\frac{W}{L}$$

is half of that for MOSFET switching transistor 340 of a memory cell 300 (FIG. 3A). As noted above, by engineering the ratio $$\frac{W}{L}$$

for the MOSFET transistor 1260 to be half the ratio for the MOSFET switching transistor 340, the voltage drop across both transistors 1260 and 340 will be the same when both are operating below a saturation level.

Figure 13:
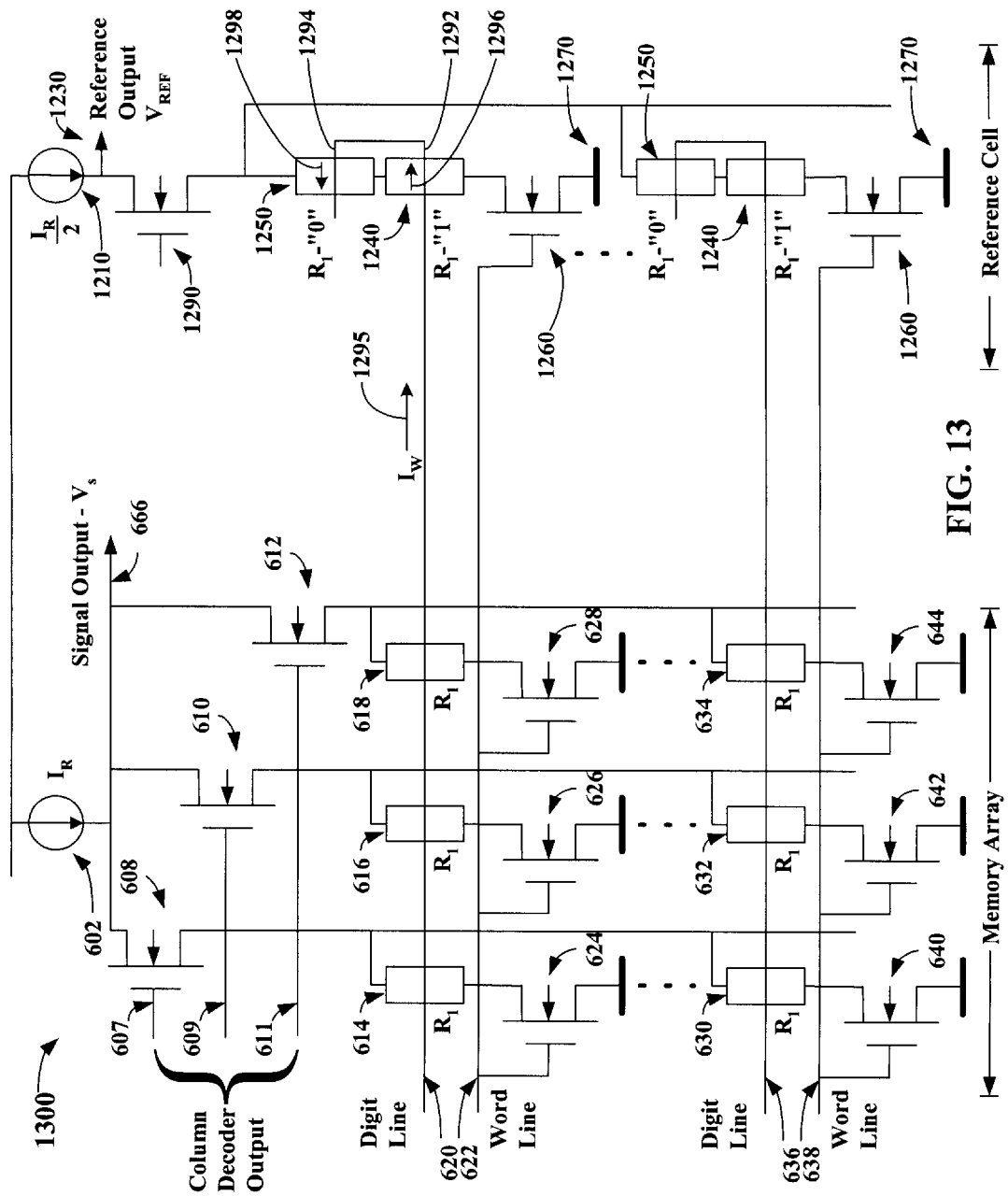
FIG. 13 is a memory block implementing a reference cell of the present invention as shown in FIG. 12.

FIG. 13 shows an embodiment of an implementation of memory block 1300 utilizing a reference cell 1200 as described in conjunction with FIG. 12. An additional MOSFET transistor 1290 is present in FIG. 13 between the reference point 1230 and the first reference cell. During a read operation the MOSFET transistor 1290 adds an additional voltage drop to the total voltage drop measured between the reference point 1230 and the current sink 1270. By engineering the ratio $$\frac{W}{L}$$

for MOSFET transistor 1290 to be half of that for MOSFET transistors 608, 610, and 612, as described above, the voltage drop across MOSFET transistor 1290 can be made to equal the voltage drop across the MOSFET transistor 608, 610, or 612 of a particular selected column.

FIG. 13 also shows that the reference circuit can include a digit line 620, 636. The digit line 620 includes a first portion 1292 proximate to the first MTJ device 1240 and a second portion 1294 proximate to the second MTJ device 1250. The digit line 620 is configured to conduct a write current $I_W$ 1295 such that it flows in a first direction 1296 in the first portion 1292 and in a second direction 1298 in the second portion 1294. Because the digit line 620 turns back on itself the first and second directions 1296 and 1298 can be parallel yet oriented in opposite directions, namely antiparallel. Provided that a substantially straight bit line (not shown) passes the first and second MTJ devices 1240 and 1250, simultaneous write currents $I_W$ in the digit and bit lines will produce combined magnetic fields with antiparallel orientations in the first and second MTJ devices 1240 and 1250 so that one is always in the high resistance setting R+ΔR while the other is in the low resistance setting R. Accordingly, reversing the direction 1295 will reverse the directions 1296 and 1298 and switch the states of the first and second MTJ devices 1240 and 1250 while maintaining the summed resistance of 2R+ΔR.

Figure 14:
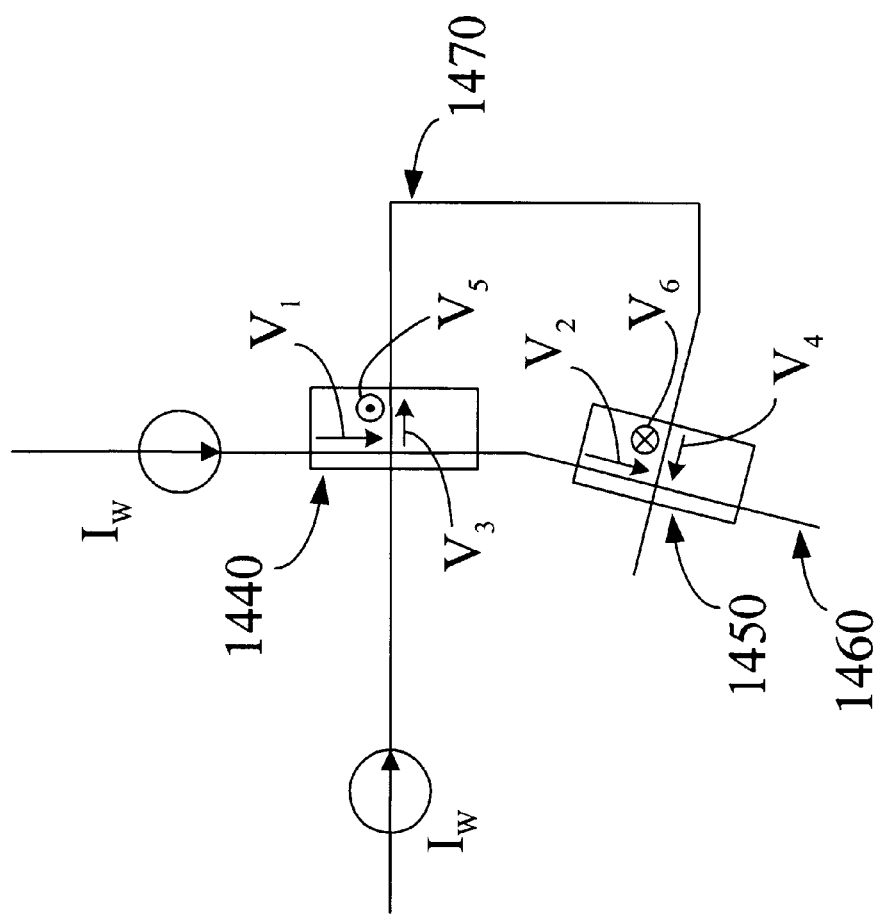
FIG. 14 is a generalized reference cell of the present invention showing the required relationships of the write currents during a write operation.

It will be appreciated that the substantially straight bit line (not shown) is not critical to the embodiment shown in FIG. 13. However, in embodiments in which the bit line is not substantially straight the first and second directions 1296 and 1298 will no longer be antiparallel. FIG. 14 illustrates the general case in which a first MTJ device 1440 and a second MTJ device 1450 are set at an angle to one another. In this embodiment a write current in a first portion of a bit line 1460 at a location proximate to the first MTJ device 1440 defines a first write current vector $V_1$ having a direction defined by both the orientation of the bit line 1460 at that location and by the direction of flow of the write current. Similarly, a second write current vector $V_2$ is defined in the bit line 1460 in a second portion at a location proximate to the second MTJ device 1450. Likewise, third and fourth write current vectors $V_3$ and $V_4$ are defined in the digit line 1470 in portions at locations proximate to the first and second MTJ devices 1440 and 1450, respectively. It will be appreciated that in FIG. 14 the bit line and the digit line are insulated from one another with one passing above the first and second MTJ devices 1440 and 1450 and the other passing below first and second MTJ devices 1440 and 1450.

As is well known, any two vectors define a cross-product that is another vector having a direction perpendicular to the first two vectors in accordance with the "right-hand rule." In FIG. 14 it can be seen that a cross-product $V_5$ of the first and third write current vectors $V_1$ and $V_3$ points out of the page of the drawing and a cross-product $V_6$ of the second and fourth write current vectors $V_2$ and $V_4$ points into the page of the drawing. In the most general case, therefore, the cross-product $V_5$ of the first and third write current vectors $V_1$ and $V_3$ should be antiparallel to the cross-product $V_6$ of the second and fourth write current vectors $V_2$ and $V_4$, as shown. In this way it is assured that during a write operation the combined magnetic fields produced at the first and second MTJ devices 1440 and 1450 will have antiparallel orientations so that one of the first and second MTJ devices 1440 and 1450 is always in the high resistance setting R+ΔR while the other is in the low resistance setting R.

Figure 15:
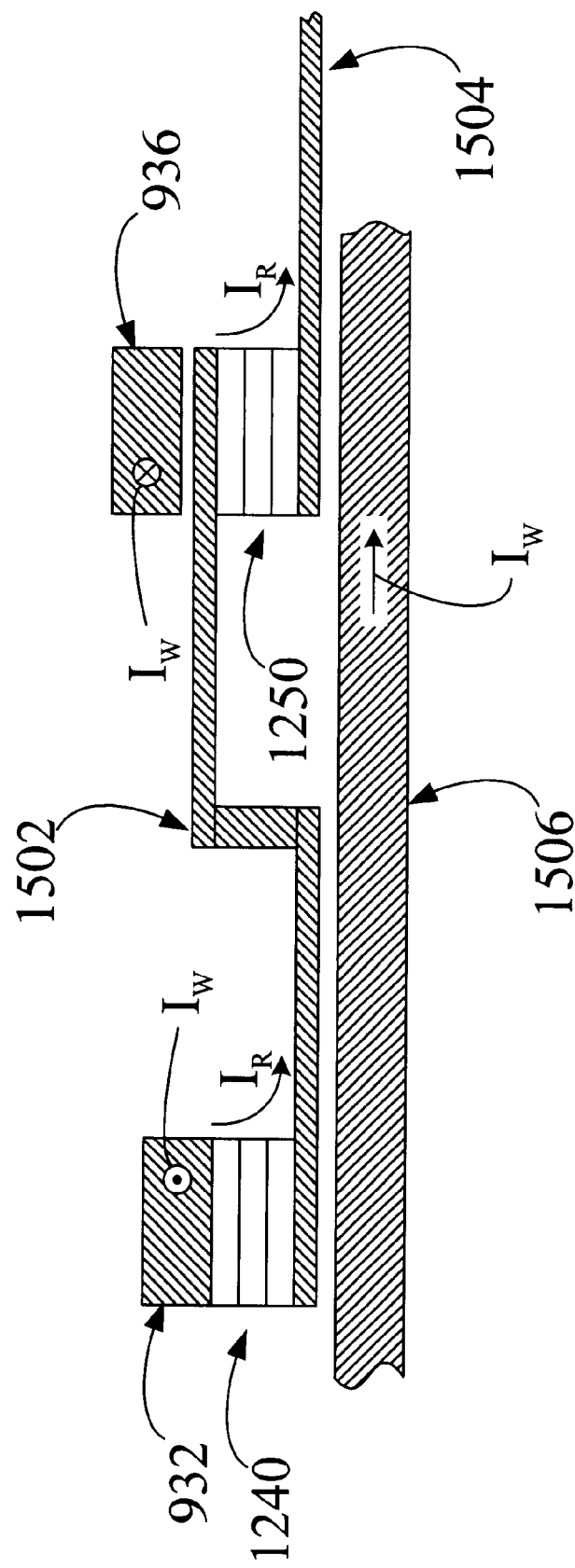
FIG. 15 is a cross-sectional representation of an embodiment of the reference cell of FIG. 12.

FIG. 15 shows a cross-section through an embodiment of the reference cell 1200 shown in FIG. 12. In this embodiment a bit line (such as bit line 930 in FIG. 9) includes a first bit line portion 932 and a second bit line portion 936. As shown in FIG. 9, the bit line reverses directions such that a write current $I_W$ flowing therein flows in opposite directions in the first and second bit line portions 932 and 936, as shown. The first bit line portion 932 is in electrical contact with a first MTJ device 1240, while the second bit line portion 936 is proximate to, but electrically insulated from, a second MTJ device 1250. A first conductive line 1502 is connected to a bottom surface of the first MTJ device 1240 and to a top surface of the second MTJ device 1250, while a second conductive line 1504 is connected to a bottom surface of the second MTJ device 1250 and leads to a current sink (not shown) such as current sink 1270 (FIG. 12). A substantially straight digit line 1506 is electrically insulated from, and passes beneath, the first and second MTJ devices 1240 and 1250.

It can be seen from FIG. 15 that in a write operation the combined magnetic fields produced at the first and second MTJ devices 1240 and 1250 will have antiparallel orientations so that one of the first and second MTJ devices 1240 and 1250 is always in the high resistance setting R+ΔR while the other is in the low resistance setting R. Further, in a read operation a read current $I_R$ can flow from the first bit line portion 932 through both the first and second MTJ devices 1240 and 1250 and to the current sink (not shown).

Figure 16:
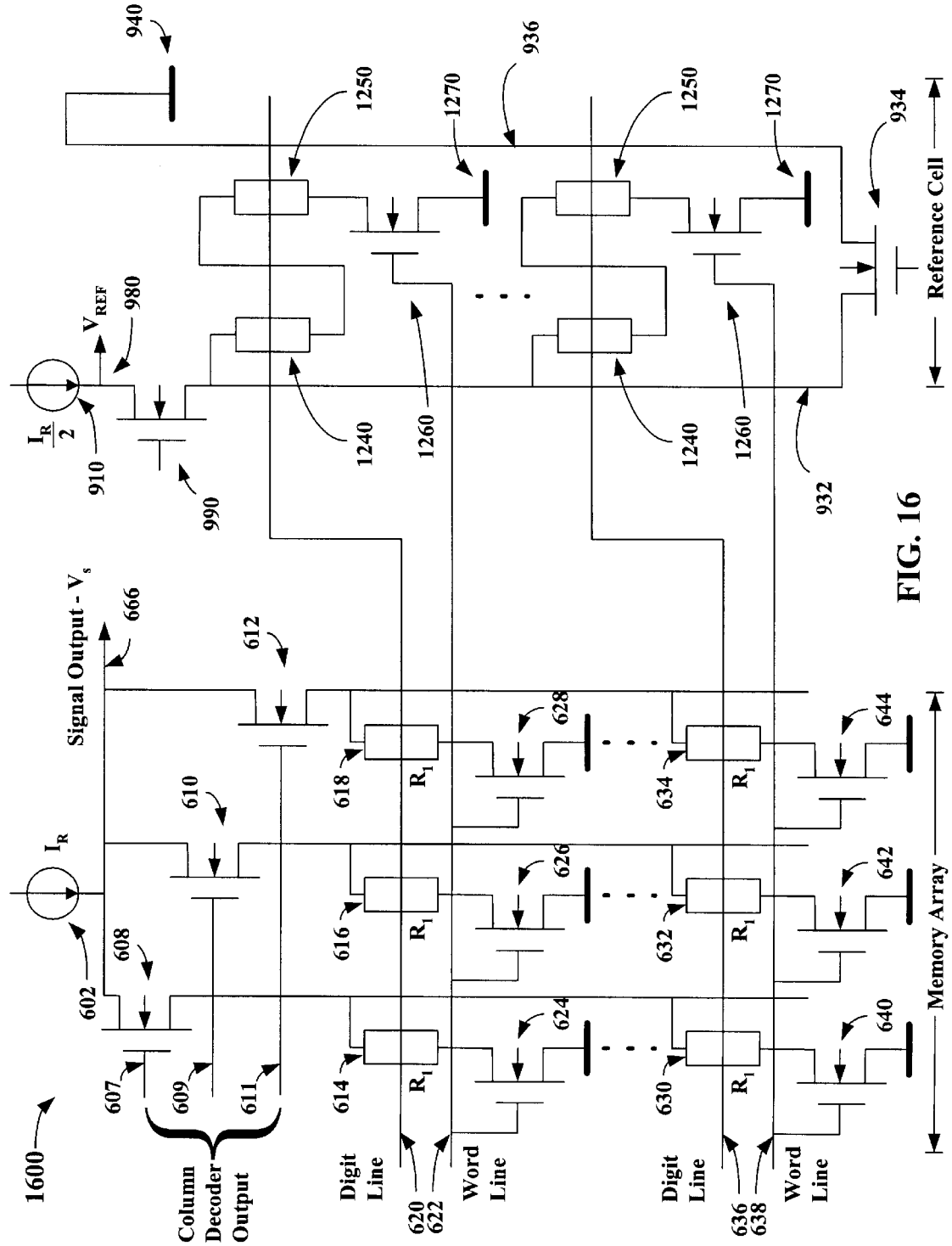
FIG. 16 is a memory block implementing the reference cell embodiment shown in FIG. 15.

FIG. 16 shows an embodiment of an implementation of memory block 1600 utilizing the embodiment of reference cell 1200 shown in FIG. 15. In contrast to the embodiment shown in FIG. 13, the embodiment in FIG. 16 has a digit line 620, 636 that is straight within the reference cell portion. During a write operation a memory cell in the memory array is selected and a write current $I_W$ is sent through each of the particular digit and bit lines that cross at that memory cell. The write current $I_W$ on the digit line also flows through a reference cell in the same row. Also during a write operation a MOSFET transistor 934 is set to a conductive state so that another write current $I_W$ can flow from a write current source (not shown) connected to the first end of the bit line (much as read current source 910) through the first and second bit line portions 932 and 936 to current sink 940. Another MOSFET transistor 1260 is set to a non-conductive state to prevent the write current $I_W$ from flowing through the MTJ devices 1240 and 1250. As previously noted, when a reference cell is set, one of the two MTJ devices 1240 and 1250 is placed in a high resistance state while the other is placed in a low resistance state. Thus, for every written memory cell there is a properly configured reference cell.

During a read operation a memory cell is selected and a read current $I_R$ is directed through it. A signal voltage $V_S$ is measured across the memory cell from a signal voltage output tap 666. During a read operation the reference cell in the same row as the memory cell is also read. The reference cell is read by setting the MOSFET transistor 1260 to a conductive state and setting the MOSFET transistor 934 to a non-conductive state so that a read current $$\frac{I_R}{2}$$

from read current source 910 must flow through the MTJ devices 1240 and 1250. A voltage $V_{REF}$ is measured from the reference point 980 to the current sink 940 and across the MTJ devices 1240 and 1250. The signal voltage $V_S$ is compared to the reference voltage $V_{REF}$ in a comparator circuit (not shown) to determine whether the signal voltage $V_S$ is higher or lower than the reference voltage $V_{REF}$ to establish the state of the memory cell.

From the descriptions of the exemplary embodiments of the method and reference cells set forth herein, it will be apparent to one of ordinary skill in the art that variations and additions to the embodiments can be made without departing from the principles of the present invention. For example, it could be easy to envision a reference cell making use of a plurality of MTJ devices that are variously programmed to either a high or low resistance setting and combined in a series-parallel circuit to arrive at a resistance of close to $$R + \frac{\Delta R}{2}.$$

Also, it could be equally easy to envision a plurality of proportional current sources and a plurality of MTJ devices, wherein the MTJ devices are variously programmed to either a high resistance state or a low resistance state with the aforementioned MTJ devices and combined in a series-parallel circuit to arrive at the aforementioned resistance of $$R + \frac{\Delta R}{2}.$$

Additionally, any of the MOSFET transistors heretofore described could readily be replaced by other elements, such as one or more bipolar transistors. It would be an obvious extrapolation from the tenets of the reference cells described to construct an equivalent circuit that is still taught by the spirit of the embodiments presented herein.

What is claimed is:

1. A reference cell for a magnetic tunnel junction MRAM, comprising:
   a bit line including
      a first end,
      a second end,
      a first transistor coupled between the first and second ends,
      a first bit line portion coupled between the first end and the first transistor, and
      a second bit line portion coupled between the second end and the first transistor;
   a digit line electrically insulated from the bit line and crossing the first bit line portion and crossing the second bit line portion;
   a second transistor;
   a first magnetic tunnel junction disposed between the first bit line portion and the digit line and electrically coupled between the second transistor and the first bit line segment; and
   a second magnetic tunnel junction disposed between the second bit line portion and the digit line and electrically coupled between the second transistor and the second bit line segment.

2. The reference cell of claim 1 further including a read current source coupled to the first end and a current sink coupled to the second end.

3. The reference cell of claim 2 further including a first write current source coupled to the first end and a second write current source coupled to the digit line.

4. The reference cell of claim 1 wherein the first transistor is a MOSFET transistor.

5. The reference cell of claim 1 wherein the second transistor is a MOSFET transistor.

6. The reference cell of claim 1 wherein the digit line crosses the first and second bit line portions at right angles.

7. A reference cell for a magnetic tunnel junction MRAM, comprising:
   a bit line including
      a first end,
      a second end,
      a first transistor coupled between the first and second ends,
      a first bit line portion coupled between the first end and the first transistor, and
      a second bit line portion coupled between the second end and the first transistor;
   a digit line electrically insulated from the bit line and crossing the first bit line portion and crossing the second bit line portion;
   a first write current source coupled to the digit line;
   a second transistor;
   a first magnetic tunnel junction disposed between the first bit line portion and the digit line and electrically coupled between the second transistor and the first bit line segment;
   a second magnetic tunnel junction disposed between the second bit line portion and the digit line and electrically coupled between the second transistor and the second bit line segment;
   a read current source and a second write current source coupled to the first end; and
   a current sink coupled to the second end.

8. The reference cell of claim 7 wherein the first write current source is configured to provide a first write current to the digit line and the second write current source is configured to simultaneously provide a second write current to the bit line, whereby one of the first and second magnetic tunnel junctions will be set to a high resistance state and the other of the first and second magnetic tunnel junctions will be set to a low resistance state.

9. The reference cell of claim 7 wherein the first magnetic tunnel junction has a resistance of R ohms and the second magnetic tunnel junction has a resistance of R+ΔR ohms.

10. A memory device comprising:
   a memory circuit including
      a memory current source configured to supply a memory current to a memory magnetic tunnel junction;
   a reference circuit including
      a bit line having
         a first end,
         a second end,
         a first transistor coupled between the first and second ends, a first bit line portion coupled between the first end and the first transistor, and
a second bit line portion coupled between the second end and the first transistor;
a digit line electrically insulated from the bit line and crossing the first bit line portion and crossing the second bit line portion;
a first write current source coupled to the digit line;
a second transistor;
a first magnetic tunnel junction disposed between the first bit line portion and the digit line and electrically coupled between the second transistor and the first bit line segment;
a second magnetic tunnel junction disposed between the second bit line portion and the digit line and electrically coupled between the second transistor and the second bit line segment;
a read current source and a second write current source coupled to the first end; and
a current sink coupled to the second end.

11. The memory device of claim 10 wherein the read current source is configured to supply to the bit line a read current that is about half of the memory current.

12. The memory device of claim 11 further including
a memory transistor having a first $$\frac{W}{L}$$

ratio and coupled to the memory magnetic tunnel junction; and
a third transistor having a second $$\frac{W}{L}$$

ratio that is half the first $$\frac{W}{L}$$

ratio and that is included in the bit line between the first end and the first bit line portion.

13. A reference cell for a magnetic tunnel junction MRAM, comprising:
a read current source;
a first magnetic tunnel junction set to a low resistance state;
a second magnetic tunnel junction set to a high resistance state;
a transistor; and
a read current sink, the first magnetic tunnel junction, the second magnetic tunnel junction, and the transistor being arranged in a series circuit between the read current source and the read current sink.

14. The reference cell of claim 13 configured such that a reference signal can be measured between the read current sink and the read current source.

15. The reference cell of claim 13 wherein the transistor is a MOSFET transistor.

16. The reference cell of claim 13 wherein the first magnetic tunnel junction has a resistance of R ohms and the second magnetic tunnel junction has a resistance of R+ΔR ohms.

17. A memory device comprising:
a memory circuit including
a memory current source configured to supply a memory current;
a memory current sink;
a memory magnetic tunnel junction; and
a memory transistor, the memory transistor and the memory magnetic tunnel junction being arranged in a series circuit between the memory current source and the memory current sink; and
a reference circuit including
a read current source;
a first magnetic tunnel junction set to a low resistance state;
a second magnetic tunnel junction set to a high resistance state;
a first reference transistor; and
a read current sink, the first magnetic tunnel junction, the second magnetic tunnel junction, and the first reference transistor being arranged in a series circuit between the read current source and the read current sink.

18. The memory device of claim 17 wherein the read current source is configured to supply a read current that is about half of the memory current.

19. The memory device of claim 18 wherein a $$\frac{W}{L}$$

ratio of the first reference transistor is about half of a $$\frac{W}{L}$$

ratio of the memory transistor.

20. The memory device of claim 17 wherein a word line connects a gate of the first reference transistor with a gate of the memory transistor.

21. The memory device of claim 17 wherein the reference circuit further includes
a substantially straight bit line proximate to both of the first and second magnetic tunnel junctions; and
a digit line having
a first portion proximate to the first magnetic tunnel junction;
a second portion proximate to the second magnetic tunnel junction; and
wherein the digit line is configured to conduct a write current such that it flows in a first direction in the first portion and in a second direction in the second portion, the second direction being substantially anti-parallel to the first direction.

22. The memory device of claim 17 wherein
the memory circuit further includes a column decoder transistor with a first $$\frac{W}{L}$$

ratio coupled between the memory current source and the memory magnetic tunnel junction; and
the reference circuit further includes a second reference transistor with a second $\frac{W}{L}$ ratio that is about half of the first $\frac{W}{L}$ ratio and coupled in series between the read current source and the first magnetic tunnel junction.

23. The memory device of claim 17 wherein the reference circuit further includes
   a bit line having
      a first bit line portion proximate to the first magnetic tunnel junction,
      a second bit line portion proximate to the second magnetic tunnel junction, and
      wherein the bit line is configured to conduct a first write current such that it flows in a first direction in the first bit line portion and in a second direction in the second bit line portion;
   a digit line having
      a first digit line portion proximate to the first magnetic tunnel junction,
      a second digit line portion proximate to the second magnetic tunnel junction, and
      wherein the digit line is configured to conduct a write current such that it flows in a third direction in the first digit line portion and in a fourth direction in the second digit line portion; and
   wherein a first vector can be defined as a cross-product of
      a vector oriented in the first direction and
      a vector oriented in the third direction, and
   wherein a second vector can be defined as a cross-product of
      a vector oriented in the second direction and
      a vector oriented in the fourth direction, and
   wherein the first and second vectors are antiparallel to one another.

24. A reference cell for a magnetic tunnel junction MRAM, comprising:
   a bit line including
      a first end,
      a second end,
      a first bit line portion between the first and second ends, and
      a second bit line portion between the first bit line portion and the second end;
   a substantially straight digit line electrically insulated from the bit line and crossing the first bit line portion and crossing the second bit line portion;
   a first magnetic tunnel junction disposed between the first bit line portion and the digit line and including
      a top surface electrically coupled to the first bit line portion, and
      a bottom surface;
   a second magnetic tunnel junction
      disposed between the second bit line portion and the digit line, electrically insulated from the second bit line portion, and including a top surface; and
   a conductive line coupled to the bottom surface of the first magnetic tunnel junction and coupled to the top surface of the second magnetic tunnel junction.

25. The reference cell of claim 24 configured such that a write current flowing in the bit line from the first end to the second end will flow in a first direction in the first bit line portion and will flow in an antiparallel direction in the second bit line portion.

26. A memory device comprising:
   at least one row including
      a digit line;
      a word line;
      a memory cell having
         a memory magnetic tunnel junction disposed proximate to the digit line and electrically insulated therefrom,
         a memory read current sink, and
         a memory transistor having
            a drain coupled to a first surface of the memory magnetic tunnel junction,
            a source coupled to the memory read current sink, and
            a gate coupled to the word line;
      a reference cell having
         a first magnetic tunnel junction disposed proximate to the digit line and electrically insulated therefrom and having top and bottom surfaces,
         a second magnetic tunnel junction disposed proximate to the digit line and electrically insulated therefrom and having top and bottom surfaces,
         a conductive line coupled between the bottom surface of the first magnetic tunnel junction and the top surface of the second magnetic tunnel junction,
         a reference read current sink,
         a first transistor having
            a drain coupled to the bottom surface of the second magnetic tunnel junction,
            a source coupled to the reference read current sink, and
            a gate coupled to the word line;
   a first bit line coupled to a second surface of the memory magnetic tunnel junction;
   a memory read current source coupled to the first bit line;
   a second bit line coupled to the top surface of the first magnetic tunnel junction; and
   a reference read current source coupled to the second bit line.

* * * * *